(12) United States Patent
Sato et al.

(10) Patent No.: US 10,636,461 B2
(45) Date of Patent: Apr. 28, 2020

(54) APPARATUSES AND METHODS FOR PROVIDING MULTIPHASE CLOCK SIGNALS

(71) Applicant: MICRON TECHNOLOGY, INC., Boise, ID (US)

(72) Inventors: Homare Sato, Sagamihara (JP); Chiaki Dono, Chigasaki (JP); Chikara Kondo, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/357,700

(22) Filed: Mar. 19, 2019

(65) Prior Publication Data

US 2019/0214061 A1     Jul. 11, 2019

Related U.S. Application Data

(62) Division of application No. 15/783,606, filed on Oct. 13, 2017, now Pat. No. 10,262,704.

(51) Int. Cl.
    *G11C 7/00*           (2006.01)
    *G11C 7/22*           (2006.01)
    (Continued)

(52) U.S. Cl.
    CPC .............. *G11C 7/22* (2013.01); *G11C 7/1066* (2013.01); *G11C 7/1093* (2013.01); *G11C 7/222* (2013.01);
    (Continued)

(58) Field of Classification Search
    CPC ....................................................... G11C 7/22
    (Continued)

(56) References Cited

U.S. PATENT DOCUMENTS

| 10,262,704 B1 | 4/2019 | Sato et al. |
| 2005/0083024 A1 | 4/2005 | Harris et al. |

(Continued)

FOREIGN PATENT DOCUMENTS

| JP | 2001127254 A | 5/2001 |
| WO | 2019074708 A1 | 4/2019 |

OTHER PUBLICATIONS

International Search Report and Written Opinion dated Jan. 29, 2019 for PCT Application No. PCT/US2018/053810, 11 pgs.

(Continued)

*Primary Examiner* — Hoai V Ho
(74) *Attorney, Agent, or Firm* — Dorsey & Whitney LLP

(57) ABSTRACT

Apparatuses and methods for providing multiphase clock signals are described. An example apparatus includes first, second, third and fourth clocked inverters, first and second clock terminals, and first and second latch circuits. An input node and an output node of the first clocked inverter is coupled respectively to an output node of the fourth clocked inverter and an input node of the second clocked inverter. An input node and an output node of the third clocked inverter is coupled to an output node of the second clocked inverter and an input node of the fourth clocked inverter. The first and second clock terminals are supplied respectively with first and second clock signals. The first latch is coupled between the output nodes of the first and third clocked inverters, and the second latch circuit is coupled between the output nodes of the second and fourth clocked inverters.

20 Claims, 11 Drawing Sheets

(51) Int. Cl.
*H03K 5/15* (2006.01)
*G11C 7/10* (2006.01)
*H03K 3/037* (2006.01)

(52) U.S. Cl.
CPC ......... *H03K 3/037* (2013.01); *H03K 5/15013* (2013.01)

(58) Field of Classification Search
USPC ....................................................... 365/193
See application file for complete search history.

(56) References Cited

U.S. PATENT DOCUMENTS

| | | |
|---|---|---|
| 2006/0156049 A1 | 7/2006 | Heliö |
| 2008/0284476 A1 | 11/2008 | Kwan et al. |
| 2009/0128198 A1 | 5/2009 | Badets et al. |
| 2010/0103746 A1 | 4/2010 | Ma |
| 2013/0293272 A1 | 11/2013 | Hesen et al. |
| 2014/0103984 A1* | 4/2014 | Goldblatt ......... H03K 3/356121 327/254 |
| 2016/0285436 A1 | 9/2016 | Neidengard et al. |
| 2019/0115057 A1 | 4/2019 | Sato et al. |

OTHER PUBLICATIONS

U.S. Appl. No. 15/783,606, entitled 'Apparatuses and Methods for Providing Multiphase Clock Signals', filed Oct. 13, 2017, pp. all.

Kim, et al., "A 20-Gb/s 256-Mb DRAM With an Inductorless Quadrature PLL and a Cascaded Pre-emphasis Transmitter", IEEE Journal of Solid-State Circuits, vol. 41, No. 1, Jan. 2006, pp. all.

First Office Action for TW Application No. 107136016, dated Oct. 15, 2019, pp. 1-8.

* cited by examiner

FIG. 7E CONTINUED
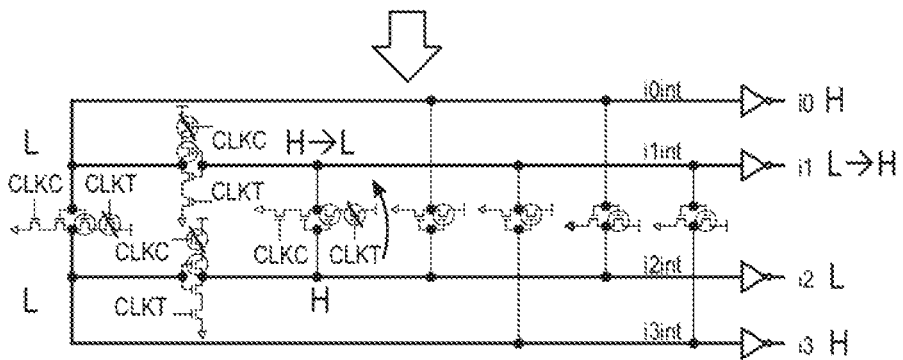
FIG. 7F
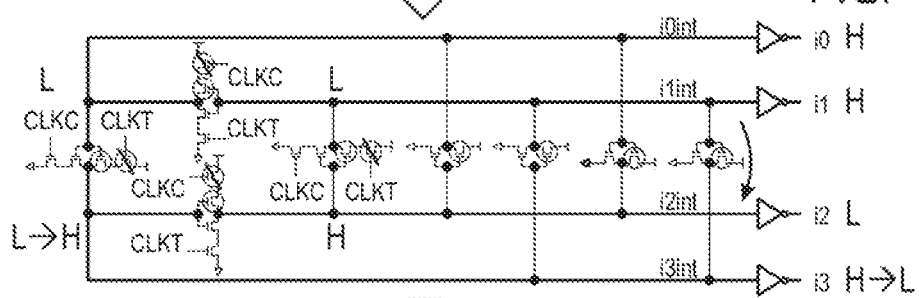
FIG. 7G
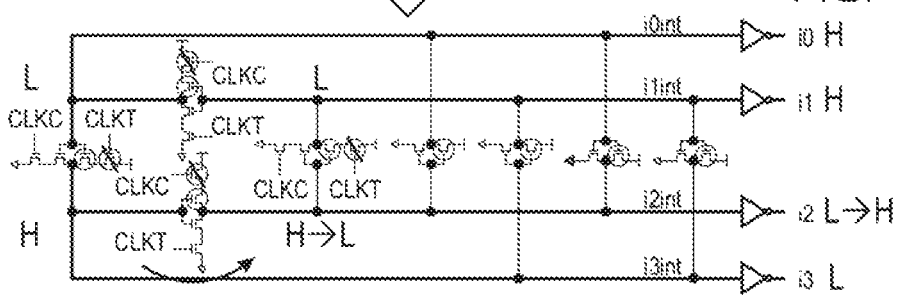
FIG. 7H
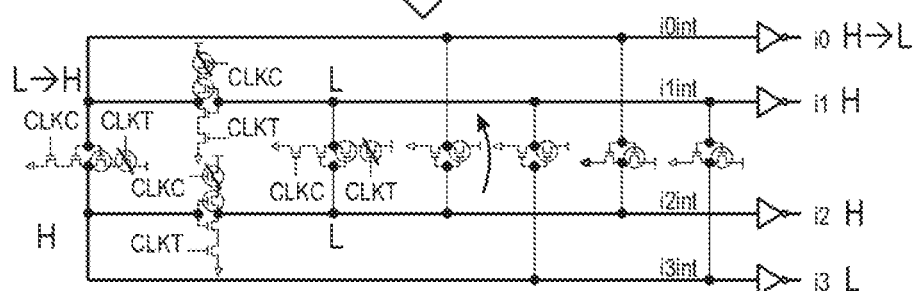
FIG. 7I

APPARATUSES AND METHODS FOR PROVIDING MULTIPHASE CLOCK SIGNALS

CROSS REFERENCE TO RELATED APPLICATION(S)

This application is a divisional of U.S. patent application Ser. No. 15/783,606 filed Oct. 13, 2017 and issued as U.S. Pat. No. 10,262,704 on Apr. 16, 2019. The aforementioned application, and issued patent, is incorporated herein by reference, in its entirety, for any purpose.

BACKGROUND

Semiconductor memories are used in many electronic systems to store data that may be retrieved at a later time. As the demand has increased for electronic systems to be faster, smaller, have greater computing ability, and consume less power, semiconductor memories that may be accessed faster, are compact, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clock signals. The various signals may be provided by a memory controller, for example. The command signals may control the semiconductor memories to perform various memory operations, for example, a read operation to retrieve data from a memory, and a write operation to store data to the memory. With newly developed memories, the memories may be provided with system clock signals that are used for timing command signals and address signals, for example, and further provided with data clock signals that are used for timing read data provided by the memory and for timing write data provided to the memory.

With regards to memory designs using data clock signals, the data clock signals are provided to a memory (e.g., from a memory controller) to synchronize provision of read data or receipt of write data by the memory. The data clock signals are provided according to a specification with a timing relative to receipt of a memory command in order to provide data or receive data to satisfy a specified timing. The memory responds to the active data clock signals and provides or receives the data accordingly.

Clock circuits included in a semiconductor memory may be used to generate internal clock signals that are used for performing various operations. For example, some clock circuits may provide multiphase clock signals based on the data clock signals. The multiphase clock signals may be used, for example, for timing the provision and/or receipt of data by the memory. The multiphase clock signals have relative phases with one another (e.g., 90 degrees) and with the data clock signals. In some memories, the clock circuits provide the multiphase clock signals having a phase relationship relative to the data clock signals that is unknown until determined by evaluation of one or more of the multiphase clock signals.

Conventional clock circuits for generating internal clock signals, however, are often cumbersome, including several complex circuits, and may have a relatively long path delay between receiving input clock signals and providing output clock signals due to having several complex circuits coupled between the input and output. Additionally, conventional clock circuits may have a relatively long recovery time from when input clock signals begin clocking from common clock levels.

BRIEF DESCRIPTION OF THE DRAWINGS

FIGS. 7A-7I are schematic diagrams of the quadrant divider circuit of FIG. 3A at the various conditions for self-oscillation according to an embodiment of the disclosure.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1A:
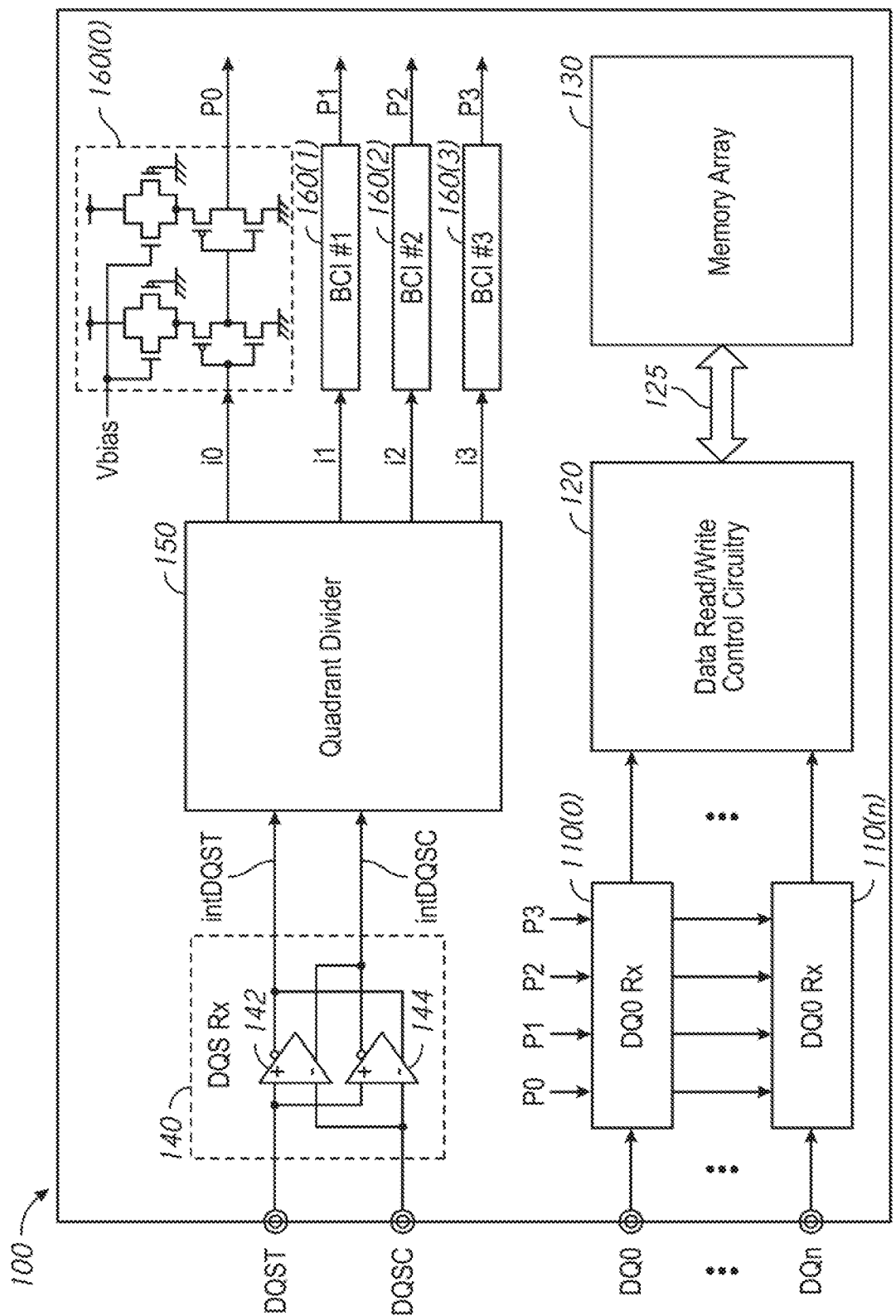
FIG. 1A is a block diagram of a portion of a memory device.

FIG. 1A is a block diagram of a portion of a memory device 100. The memory device 100 includes data receiver circuits 110(0)-110(n) that receive respective data on data terminals DQ0-DQn, where n is a whole number. The receiver circuits 110(0)-110(n) are clocked by phase signals P0, P1, P2, and P3 to capture respective data responsive to the phase signals P0, P1, P2, and P3. The captured data are provided by the receiver circuits 110(0)-110(n) to data read/write control circuitry 120. The data read/write control circuitry 120 provides the data from the receiver circuits 110(0)-110(n) over a data bus 125 to a memory array 130.

The data may be stored in memory cells of the memory array 130. The data read/write control circuitry 120 may further read data from the memory array 130 and provide the data to the DQ0-DQn terminals through data transfer circuits (not shown). The data read/write control circuitry 120 may include, for example, serial-to-parallel circuits, parallel-to-serial circuits, data latches, data amplifiers, write amplifiers, as well as other or alternative circuits that prepare the data to be provided to or provided from the memory array 130.

The memory device 100 further includes a strobe signal receiver circuit 140 that receives strobe signals DQST and DQSC. The DQST and DQSC signals may be data strobe signals that may be used by the memory device 100 to time the capture of data provided to the DQ0-DQn terminals. The strobe signals DQST and DQSC are complementary. That is, the DQST signal changes from a low clock level to a high clock level (e.g., a rising clock edge) at the same time as the DQSC signal changes from a high clock level to a low clock level (e.g., a falling clock edge), and the DQST signal changes from a high clock level to a low clock level at the same time as the DQSC signal changes from a low clock level to a high clock level. The strobe signal receiver circuit 140 includes receiver circuits 142 and 144. The receiver circuits 142 and 144 are provided the DQST and DQSC signals. The receiver circuits 142 and 144 provide internal strobe signal intDQST and intDQSC based on the DQST and DQSC signals. The intDQST and intDQSC signals have the same clock frequency as the DQST and DQSC signals.

Figure 1B:
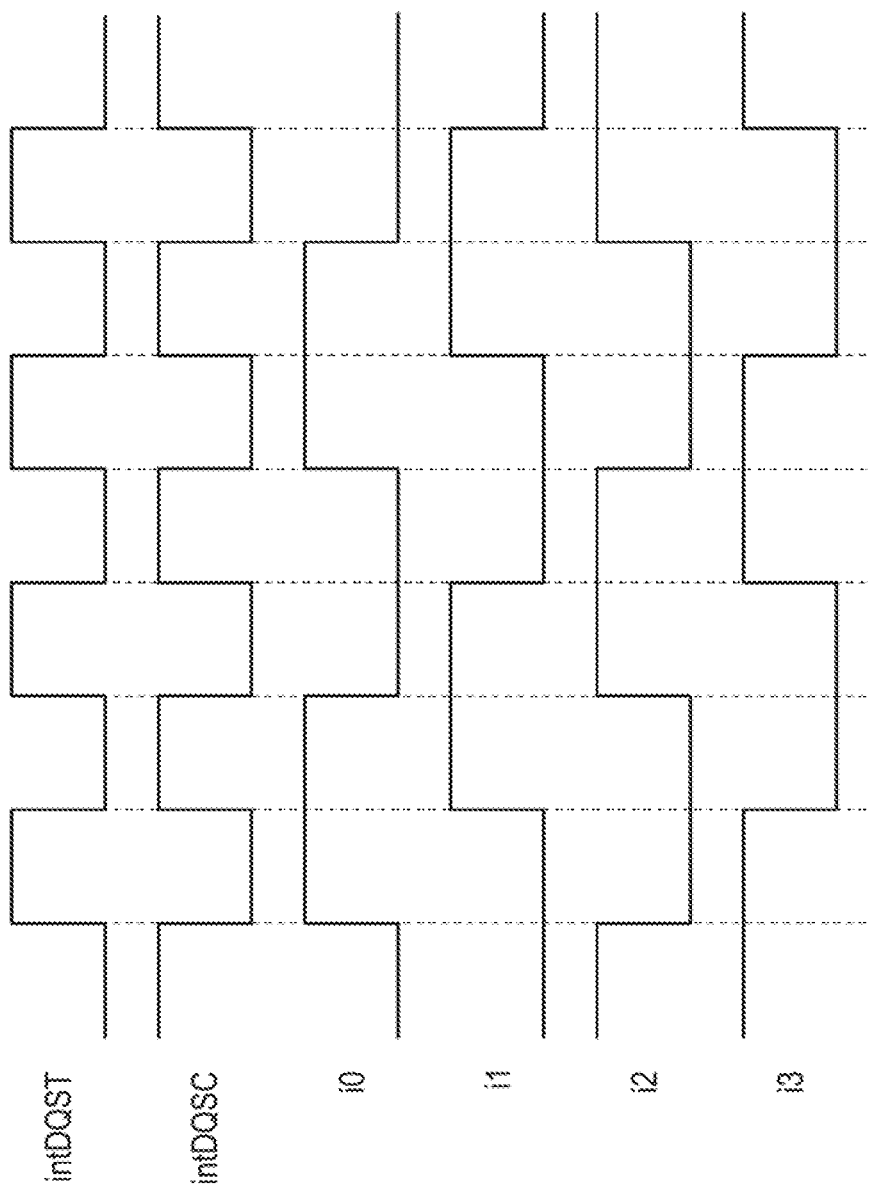
FIG. 1B is a timing diagram of the signals provided by a quadrant divider circuit included in the memory device of FIG. 1A.

The intDQST and intDQSC signals are provided to a quadrant divider circuit 150. The quadrant divider circuit provides i0, i1, i2, and i3 signals based on the intDQST and intDQSC signals. The i0, i1, i2, and i3 signals are periodic signals that change between a high clock level and a low clock level, and have a clock frequency that is one-half the clock frequency of the intDQST and intDQSC signals. The i0, i1, i2, and i3 signals may be multiphase clock signals in some embodiments of the disclosure. Multiphase clock signals have different phases relative to one another. For example, the i0, i1, i2, and i3 signals have a 90-degree phase relationship relative with one another and a timing based on the intDQST and intDQSC signals. In particular, the i1 signal is shifted by 90-degrees relative to the i0 signal, the i2 signal is shifted by 90-degrees relative to the i1 signal, and the i3 signal is shifted by 90-degrees relative to the i2 signal. The i0 and i2 signals have rising and falling clock edges that correspond to rising clock edges of the intDQST signal and the i1 and i3 signals have rising and falling clock edges that correspond to falling clock edges of the intDQST signal. The i0, i1, i2, and i3 signals may be referred to as "quadrature" clock signals. FIG. 1B is a timing diagram of the intDQST and intDQSC signals, and of the i0, i1, i2, and i3 signals provided by a quadrant divider circuit 150.

The i0, i1, i2, and i3 signals are provided by the quadrant divider circuit 150 to respective bias controlled inverter circuits 160(0)-160(3). Each of the bias controlled inverter circuits 160(0)-160(3) is provided a bias voltage Vbias. The Vbias voltage may be used to control an operating point of each bias controlled inverter circuit 160(0)-160(3), for example, to adjust for drifts in temperature, power, voltage, and so on. The bias controlled inverter circuits 160(0)-160(3) provide respective phase signals P0, P1, P2, and P3. The phase signals P0, P1, P2, and P3 are provided to the data receiver circuits 110(0)-110(n), which are used to clock the data receiver circuits 110(0)-110(n) to capture data provided to the DQ0-DQn terminals as previously described.

It will be appreciated that the memory device 100 may include additional circuits and terminals, such as clock signals, command/address terminals and so on, than those shown in FIG. 1A, which have been omitted from FIG. 1A in the interests of brevity and to avoid unnecessarily obscuring the subject matter described.

Figure 2:
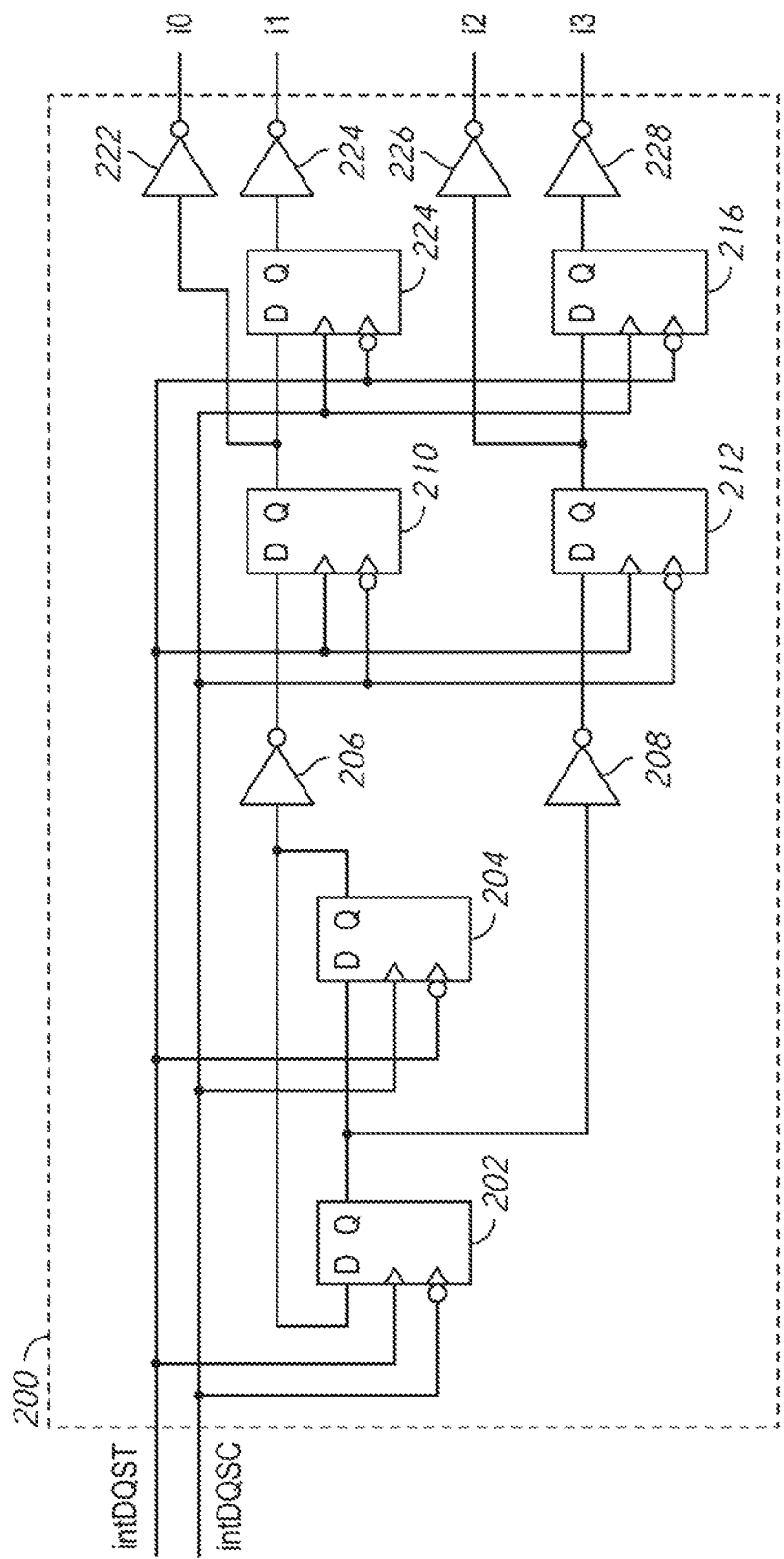
FIG. 2 is a schematic diagram of an example of a conventional quadrant divider circuit.

FIG. 2 is a schematic diagram of an example of a conventional quadrant divider circuit 200. The quadrant divider 200 provides i0, i1, i2, and i3 signals responsive to the intDQST and intDQSC signals. As previously described, the intDQST and intDQSC signals are complementary. The i0, i1, i2, and i3 signals are periodic signals that change between a high clock level and a low clock level, and have a clock frequency that is one-half the clock frequency of the intDQST and intDQSC signals. The i0, i1, i2, and i3 signals have a 90-degree relative phase relationship with one another and may be referred to as "quadrature" clock signals.

The quadrant divider circuit 200 includes D flip-flop (DFF) circuits 202, 204, 210, 212, 214, and 216. The DFF circuits are clocked by the intDQST and intDQSC signals to latch the logic level provided to the respective D input node and provide the corresponding logic level at the respective Q output node. The DFF circuits 202, 210, and 212 are clocked responsive to the intDQST and intDQSC signals having high and low clock levels, respectively. The DFF circuits 204, 214, and 216 are clocked responsive to the intDQST and intDQST signals having the low and high clock levels, respectively. The quadrant divider circuit 200 further includes inverter circuits 222, 224, 226, and 228. The inverter circuit 222 receives the output from the DFF circuit 210 to provide the i0 signal. The inverter circuit 224 receives the output from the DFF circuit 214 to provide the i1 signal. The inverter circuit 226 receives the output from the DFF circuit 212 to provide the i2 signal. The inverter circuit 228 receives the output from the DFF circuit 216 to provide the i3 signal.

In operation, as the intDQST and intDQSC signals clock between the high and low clock levels, the DFF circuits 202 and 204 sequentially latch respective inputs and provide the respective outputs to the DFF circuits 212 and 210 through the inverter circuits 208 and 206, all respectively. The following transition of the intDQST and DQSC signals cause the DFF circuits 210 and 212 to latch respective inputs and provide the respective outputs to the inverters 222 and 226, and to the DFF circuits 214 and 216, all respectively. The DFF circuits 214 and 216 then provide respective outputs to the inverter circuits 224 and 228 responsive to the following transition of the intDQST and intDQSC signals to provide the i1 and i3 signals, all respectively. The resulting i0, i1, i2, and i3 signals are quadrature signals having a clock frequency that is one-half the clock frequency of the intDQST and intDQSC signals, as previously described.

While the quadrant divider circuit 200 is capable of providing the quadrature signals i0, i1, i2, and i3 with half the clock frequency of the intDQST and intDQSC signals, the quadrant divider circuit 200 has several shortcomings. For example, the path delay time between the input of the intDQST and intDQSC signals to when the i0, i1, i2, and i3 clock signals are provided is relatively long, requiring input and output signals of the DFF circuits to propagate through multiple levels of DFF circuits before the i0, i1, i2, and i3 signals are provided. Another shortcoming occurs when the intDQST and intDQSC signals begin clocking from the same clock level (e.g., the intDQST and intDQSC signals are both at a high logic level or both at a low logic level). The quadrant divider circuit 200 has a relatively long recovery time from when the intDQST and intDQSC signals begin clocking from the same clock level to when the i0, i1, i2, and i3 are provided having the correct quadrature phase relationship and clock frequency. Another shortcoming is that the quadrant divider circuit 200 is relatively large because it includes several circuits, many of which are complex circuits (e.g., six DFF circuits). Thus, alternative quadrant divider circuits may be desirable.

Figure 3B:
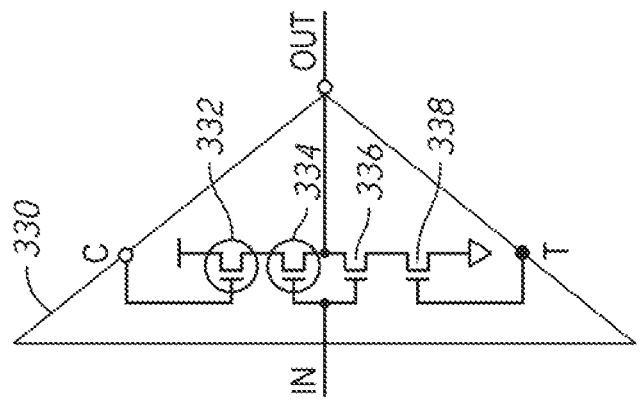
FIG. 3B is a schematic diagram of a clocked inverter circuit according to an embodiment of the disclosure.
Figure 3A:
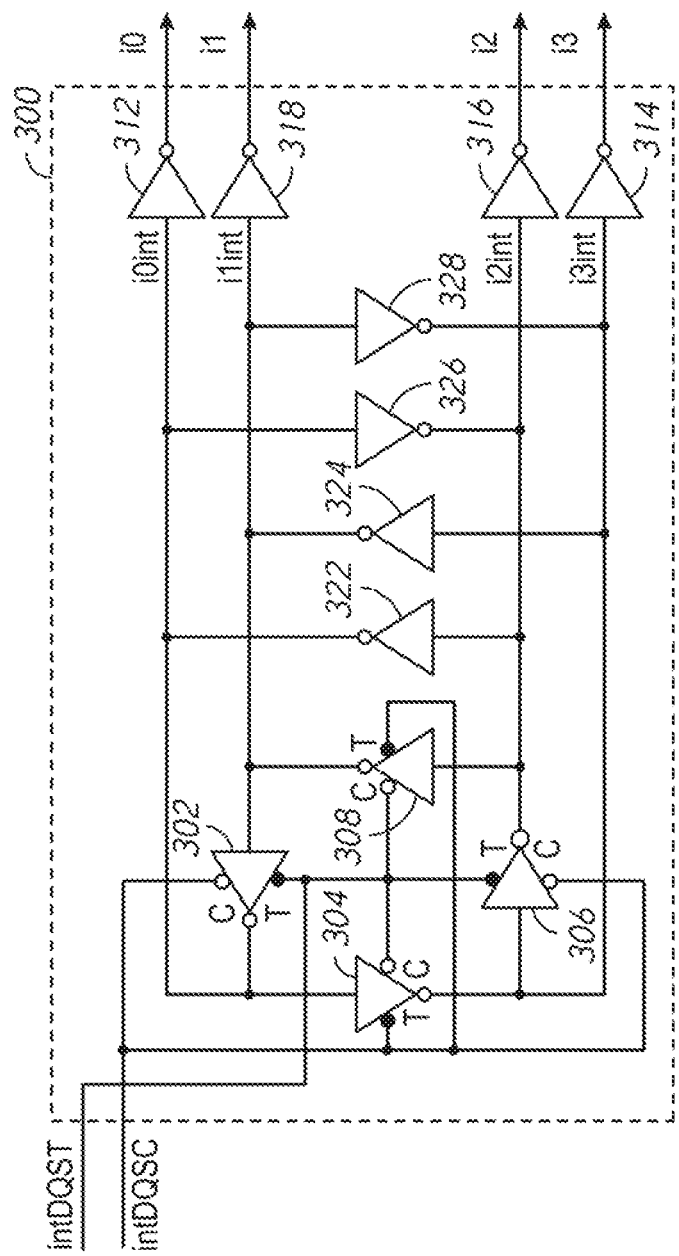
FIG. 3A is a schematic diagram of a quadrant divider circuit according to an embodiment of the disclosure.

FIG. 3A illustrates a quadrant divider circuit 300 according to an embodiment of the disclosure. The quadrant divider circuit 300 provides multiphase signals i0, i1, i2, and i3 responsive to intDQST and intDQSC signals. The quadrant divider circuit 300 includes clocked inverter circuits 302, 304, 306, and 308. The clocked inverter circuits 302, 304, 306, and 308 are coupled in a ring with an output node of the clocked inverter circuit 302 coupled to an input node of the clocked inverter circuit 304, an output node of the clocked inverter circuit 304 coupled to an input node of the clocked inverter circuit 306, an output node of the clocked inverter circuit 306 coupled to an input node of the clocked inverter circuit 308, and an output node of the clocked inverter circuit 308 coupled to an input node of the clocked inverter circuit 302. Each of the clocked inverter circuits 302, 304, 306, and 308 includes a true clock node T and a complementary clock node C. The T clock nodes of the clocked inverter circuits 302 and 306 and C clock nodes of the clocked inverters 304 and 308 are provided with the intDQST signal. The C clock nodes of the clocked inverter circuits 302 and 306 and the T clock nodes of the clocked inverter circuits 304 and 308 are provided with the intDQSC signal. As previously described, the intDQSC signal is complementary to the intDQST signal.

When activated, the clocked inverter circuits 302, 304, 306, and 308 provide an output signal at the respective output node having a level complementary to a level of an input signal provided at the respective input node. The clocked inverter circuits 302 and 306 are active when the intDQST signal changes to a high clock level and the intDQSC signal changes to a low clock level. The clocked inverter circuits 304 and 308 are active when the intDQST signal changes to a low clock level and the intDQSC signal changes to a high clock level.

The quadrant divider circuit 300 further includes inverter circuits 322, 324, 326, and 328. The inverter circuits 322 and 326 are coupled between the output node of the clocked inverter circuit 302 and the output node of the clocked inverter circuit 306. The inverter circuits 322 and 326 form a latch circuit for the outputs of the clocked inverter circuits 302 and 306. In particular, an output node of the inverter circuit 322 is coupled to an input node of the inverter circuit 326 and an output node of the inverter circuit 326 is coupled to an input node of the inverter circuit 322, and the input node of the inverter circuit 322 is coupled to the output node of the clocked inverter circuit 306 and the input node of the inverter circuit 326 is coupled to the output node of the clocked inverter 302. The inverter circuits 324 and 328 are coupled between the output node of the clocked inverter circuit 304 and the output node of the clocked inverter circuit 308. The inverter circuits 324 and 328 form a latch circuit for the outputs of the clocked inverter circuits 304 and 308. In particular, an output node of the inverter circuit 324 is coupled to an input node of the inverter circuit 328 and an output node of the inverter circuit 328 is coupled to an input node of the inverter circuit 324, and the input node of the inverter circuit 324 is coupled to the output node of the clocked inverter circuit 308 and the input node of the inverter circuit 328 coupled to the output node of the clocked inverter 304.

The inverter circuits 322 and 326 coupled between i0int and i2int nodes may serve as a latch circuit to hold the respective levels during a Hi-Z (high-impedance) state of the clocked inverters. Similarly, the inverter circuits 324 and 328 coupled between i1int and i3int nodes may serve as another latch circuit to hold the respective levels during a Hi-Z (high-impedance) state of the clocked inverters.

Inverter circuits 312, 318, 316, and 314 receive the output signals i0int, i1int, i2int, i3int from the output nodes of the clocked inverter circuits 302, 308, 306, and 304, respectively, and provide respective output signals i0, i1, i2, and i3. As will be described in more detail below, the output signals i0, i1, i2, and i3 have a 90 degree phase relative to one another, and may be referred to as "quadrature" clock signals. The output signals also have a clock frequency that is one-half the clock frequency of the intDQST and intDQSC signals. The phase relationship and frequency of the i0, i1, i2, and i3 signals are the same as that shown for the i0, i1, i2, and i3 signals of FIG. 1B.

FIG. 3B is a schematic diagram of a clocked inverter circuit 330 according to an embodiment of the disclosure. The clocked inverter circuit 330 includes an inverter including p-type transistor 334 and n-type transistor 336. It should be noted that p-type and n-type may indicate p-channel and n-channel, respectively. An input signal IN is provided to an input node that is coupled to gates of the p-type and n-type transistors 334 and 336, and an output signal OUT is provided at an output node that is coupled to drains of the p-type and n-type transistors 334 and 336. The clocked inverter circuit 330 further includes p-type transistor 332 coupled to the p-type transistor 334 and n-type transistor 338 coupled to the n-type transistor 336. The p-type transistor 332 is configured to receive a pull-up voltage from a voltage supply (e.g., VDD) and the n-type transistor 338 is configured to receive a pull-down voltage from a voltage reference (e.g., ground). A gate of the n-type transistor 338 is coupled to a true clock node T and a gate of the p-type transistor 332 is coupled to a complementary clock node C. Complementary clock signals (e.g., intDQST and intDQSC) are provided respectively to the T and C nodes to activate the clocked inverter circuit 330. In operation, the clocked inverter circuit 330 provides an OUT signal that is the complement of the IN signal when activated by a high clock level at the T node and a low clock level at the C node. When the clocked inverter circuit is deactivated by a low clock level at the T node and a high clock level at the C node, the clocked inverter circuit 330 is in a high-impedance state and the output node is floating.

The clocked inverter circuit 330 may be used for the clocked inverter circuits 302, 304, 306, and 308 of the quadrant divider circuit 300 of FIG. 3A in some embodiments of the disclosure.

Figure 4:
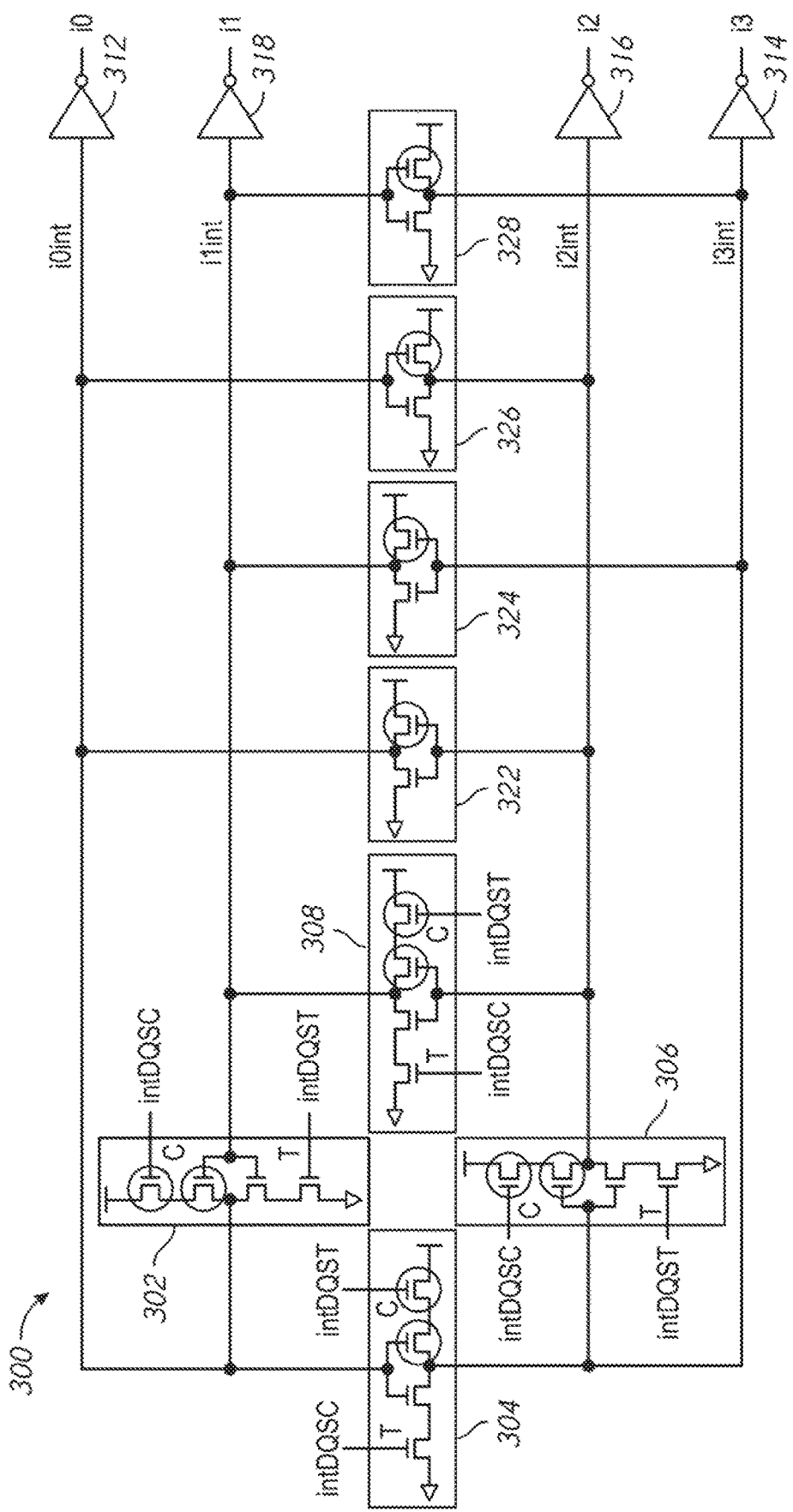
FIG. 4 is a schematic diagram of the quadrant divider circuit of FIG. 3A including the clocked inverter circuit of FIG. 3B.

FIG. 4 is a schematic diagram of the quadrant divider circuit 300 including the clocked inverter circuit 330 of FIG. 3B as the clocked inverter circuits 302, 304, 306, and 308. The inverter circuits 322, 324, 326, and 328 are also shown in more detail in FIG. 4. Each of the inverter circuits 322, 324, 326, and 328 include a p-type transistor and an n-type transistor. The input node of each inverter circuit 322, 324, 326, and 328 is coupled to the gates of the p-type and n-type transistors, and the output node is coupled to drains of the p-type and n-type transistors.

Operation of the quadrant divider circuit 300 will be described with reference to FIGS. 3 and 4, and also FIG. 5.

Figure 5:
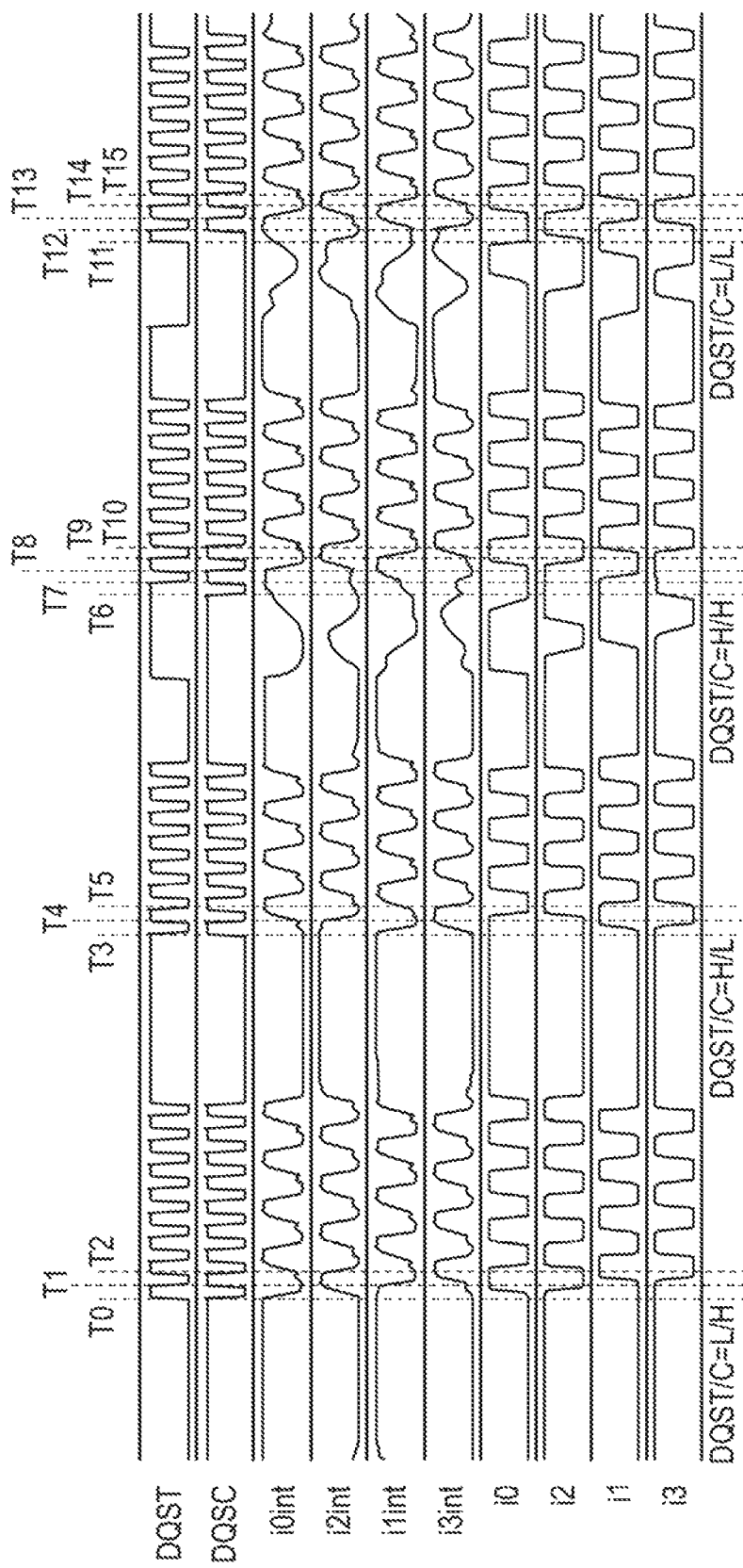
FIG. 5 is a timing diagram of various signals during operation of the quadrant divider circuit FIG. 3A according to an embodiment of the disclosure.

FIG. 5 is a timing diagram of various signals during operation of the quadrant divider circuit 300 according to an embodiment of the disclosure. The timing diagram of FIG. 5 shows four cases for initiation of clocking by the quadrant divider circuit 300.

A first case is shown with reference to times T0 through T2. Prior to time T0, the DQST signal (which is representative of the intDQST signal) is at a low clock level and the DQSC signal (which is representative of the intDQSC signal) is at a high clock level. Also prior to time T0, the i0*int* and the i1*int* signals are at a high clock level and the i2*int* and in3*int* signals are at a low clock level. As a result, the i0 and i1 signals provided by the inverter circuits 312 and 318 are at a low clock level and the i2 and i3 signals provided by the inverter circuits 316 and 314 are at a high clock level.

When the DQST signal changes to a high clock level and the DQSC signal changes to a low clock level at time T0, the clocked inverters 302 and 306 are activated and the i0*int* signal changes to a low clock level and the i2*int* signal changes to a high clock level. The clocked inverters 304 and 306 remain inactive because of the high clock level DQST signal and the low clock level DQSC signal. As a result, the i0 signal changes to a high clock level and the i2 signal changes to a low clock signal.

At time T1, the DQST signal changes to a low clock level and the DQSC signal changes to a high clock level. The clocked inverters 302 and 306 are deactivated and the clocked inverters 304 and 308 are activated. The i1*int* signal changes to a low clock level and the i3*int* signal changes to a high clock level in response to the clocked inverters 304 and 308 being activated. The i1 signal and the i3 signals change to high and low clock levels, respectively, as the i1*int* and i3*int* signals change.

At time T2, the DQST signal changes to a high clock level and the DQSC signal changes to a low clock level again, causing the clocked inverters 302 and 306 to be activated and the clocked inverters 304 and 308 to be deactivated. The i0*int* and i2*int* signals change to high and low clock levels, respectively, and the i0 and i2 signal change to low and high clock levels, respectively, in response.

As the DQST and DQSC signals continue to change between the high and low clock levels, the clocked inverters 302 and 306, and clocked inverters 304 and 308 are alternately activated and deactivated to provide the oscillating signals of i0*int* and i2*int*, and i1*int* and i3*int*. During the oscillation of the i0*int* and i2*int* signals, and the i1*int* and i3*int* signals, the inverter circuits 322 and 326 function as a latch to latch the clock levels of the i0*int* and i2*int* signals and the inverter circuits 324 and 328 function as a latch to latch the clock levels of the of the i1*int* and i3*int* signals.

As previously described in the first case example, oscillation of the i0 and i2 signals begins with a first change of the DQST signal from the low clock level to the high clock level and of the DQSC signal from the high clock level to the low clock level (e.g., at time t0) and oscillation of the i1 and i3 signals begins with a first change of the DQST signal from the high clock level to the low clock level and of the DQSC signal from the low clock level to the high clock level. The initiation of the oscillation of the i0, i1, i2, and i3 signals is relatively immediate, responding to the first changes in clock levels of the DQST and DQSC signals. A self-oscillation state is achieved and the i0, i1, i2, and i3 signals continue to oscillate.

A second case is shown with reference to times T3 through T5. Prior to time T3, the DQST signal is at a high clock level and the DQSC signal is at a low clock level. Also prior to time T3, the i0*int* and the i3*int* signals are at a low clock level and the i1*int* and in2*int* signals are at a high clock level. As a result, the i0 and i3 signals provided by the inverter circuits 312 and 318 are at a high clock level and the i1 and i2 signals provided by the inverter circuits 316 and 314 are at a low clock level.

When the DQST signal changes to a low clock level and the DQSC signal changes to a high clock level at time T3, the clocked inverters 304 and 308 are activated and the i1*int* signal changes to a low clock level and the i3*int* signal changes to a high clock level. The clocked inverters 302 and 306 remain inactive because of the low clock level DQST signal and the high clock level DQSC signal. As a result, the i1 signal changes to a high clock level and the i3 signal changes to a low clock signal.

At time T4, the DQST signal changes to a high clock level and the DQSC signal changes to a low clock level. The clocked inverters 304 and 308 are deactivated and the clocked inverters 302 and 306 are activated. The i0*int* signal changes to a high clock level and the i2*int* signal changes to a low clock level in response to the clocked inverters 302 and 306 being activated. The i0 signal and the i2 signals change to low and high clock levels, respectively, as the i0*int* and i2*int* signals change.

At time T5, the DQST signal changes to a low clock level and the DQSC signal changes to a high clock level again, causing the clocked inverters 304 and 308 to be activated and the clocked inverters 302 and 306 to be deactivated. The i1*int* and i3*int* signals change to high and low clock levels, respectively, and the i1 and i3 signal change to low and high clock levels, respectively, in response.

As the DQST and DQSC signals continue to change between the low and high clock levels, the clocked inverters 304 and 308, and clocked inverters 302 and 306 are alternately activated and deactivated to provide the oscillating signals of i1*int* and i3*int*, and i0*int* and i2*int*. During the oscillation of the i1*int* and i3*int* signals, and the i0*int* and i2*int* signals, the inverter circuits 322 and 326 function as a latch to latch the clock levels of the i0*int* and i2*int* signals and the inverter circuits 324 and 328 function as a latch to latch the clock levels of the of the i1*int* and i3*int* signals.

As previously described in the second case example, oscillation of the i1 and i3 signals begins with a first change of the DQST signal from the high clock level to the low clock level and of the DQSC signal from the low clock level to the high clock level (e.g., at time t3) and oscillation of the i0 and i2 signals begins with a first change of the DQST signal from the low clock level to the high clock level and of the DQSC signal from the high clock level to the low clock level. The initiation of the oscillation of the i0, i1, i2, and i3 signals is relatively immediate, responding to the first changes in clock level to the DQST and DQSC signals. A self-oscillation state is achieved and the i0, i1, i2, and i3 signals continue to oscillate.

A third case is shown with reference to times T6 through T10. Prior to time T6, the DQST signal is at a high clock level and the DQSC signal is also at a high clock level. In such a condition, none of the clocked inverter circuits are activated (e.g., with reference to the clocked inverter circuit of FIG. 3B, while the n-type transistor 338 is activated, the p-type transistor 332 is not activated). The resulting i0*int*, i1*int*, i2*int*, and i3*int* are unpredictable. The clock levels of the i0, i1, i2, and i3 signals, however, are known due to the latching of the respective clock levels by the latches formed by the inverter circuits 322 and 326, and formed by the inverter circuits 324 and 328. As shown in the example of FIG. 5, prior to time T6, the i0, i1, and i2 signals are at the high clock level and the i3 signal is at the low clock level.

When the DQSC signal changes to the low clock level and the DQST signal remains at the high clock level at time T6, the clocked inverter circuits 302 and 306 are activated and the clocked inverter circuits 304 and 308 are not activated. The i0*int* signal begins to transition to the high clock level and the i3*int* signal begins to transition to the low clock level, which causes the i0 signal to change to a low clock level through the inverter circuit 312 and the i3 signal to change to a high clock level at time T6 through the inverter circuit 314. At time T7 the DQST and DQSC signals change to the low and high clock levels, respectively, activating the clocked inverter circuits 304 and 308 and deactivating the clocked inverter circuit 302 and 306. The i1*int* signal begins to change to the high clock level causing the i1 signal to change to the low clock level through the inverter circuit 318 at time T7.

At time T8 the DQST and DQSC signals change to the high and low clock levels, respectively, activating the clocked inverter circuits 302 and 306 and deactivating the clocked inverter circuit 304 and 308. The i2*int* signal begins to change to the high clock level causing the i2 signal to change to the low clock level through the inverter circuit 316 at time T8. The DQST and DQSC signals continue to clock at times T9 and T10, alternately deactivating and activating the clocked inverter circuits 302 and 306, and the clocked inverter circuits 304 and 308 to provide changing i0*int* and i2*int* signals and changing i1*int* and i3*int* signals. As a result, the i0 and i2, and i1 and i3 signals continue to oscillate between the high and low clock levels. During the oscillation of the i1*int* and i3*int* signals, and the i0*int* and i2*int* signals, the inverter circuits 322 and 326 function as a latch to latch the clock levels of the i0*int* and i2*int* signals and the inverter circuits 324 and 328 function as a latch to latch the clock levels of the of the i1*int* and i3*int* signals.

A fourth case is shown with reference to times T11 through T15. Prior to time T11, the DQST signal is at a low clock level and the DQSC signal is also at a low clock level. In such a condition, none of the clocked inverter circuits are activated (e.g., with reference to the clocked inverter circuit of FIG. 3B, while the p-type transistor 332 is activated, the n-type transistor 338 is not activated). The resulting i0*int*, i1*int*, i2*int*, and i3*int* are unpredictable. The clock levels of the i0, i1, i2, and i3 signals, however, are known due to the latching of the respective clock levels by the latches formed by the inverter circuits 322 and 326, and formed by the inverter circuits 324 and 328. As shown in the example of FIG. 5, prior to time T11, the i0 and i1 signals are at the high clock level and the i2 and i3 signals are at the low clock level.

When the DQST signal changes to the high clock level and the DQSC signal remains at the low clock level at time T11, the clocked inverter circuits 302 and 306 are activated and the clocked inverter circuits 304 and 308 are not activated. The i0*int* signal begins to transition to the high clock level and the i2*int* signal begins to transition to the low clock level, which causes the i0 signal to change to a low clock level through the inverter circuit 312 and the i2 signal to change to a high clock level at time T11 through the inverter circuit 316. At time T12 the DQST and DQSC signals change to the low and high clock levels, respectively, activating the clocked inverter circuits 304 and 308 and deactivating the clocked inverter circuit 302 and 306. The i1*int* signal begins to change to the high clock level and the i3*int* signal begins to transition to the low clock level, which causes the it signal to change to the low clock level through the inverter circuit 318 and the i3 signal to change to the high clock level at time T12.

At time T13 the DQST and DQSC signals change to the high and low clock levels, respectively, activating the clocked inverter circuits 302 and 306 and deactivating the clocked inverter circuit 304 and 308. The i0*int* signal changes to the low clock level and the i2*int* signal changes to the high clock level, which causes the i0 signal to change to a high clock level through the inverter circuit 312 and the i2 signal to change to a low clock level at time T13 through the inverter circuit 316. The DQST and DQSC signals continue to clock at times T14 and T15, alternately deactivating and activating the clocked inverter circuits 302 and 306, and the clocked inverter circuits 304 and 308 to provide changing i0*int* and i2*int* signals and changing i1*int* and i3*int* signals. As a result, the i0 and i2, and i1 and i3 signals continue to oscillate between the high and low clock levels. As a result, the i0 and i2, and i1 and i3 signals continue to oscillate between the high and low clock levels.

The initiation of the oscillation of the i0, i1, i2, and i3 signals for the third and fourth cases is, as with the first and second cases, relatively immediate, responding quickly to the first changes in clock level to the DQST and DQSC signals. The quadrant divider circuit 300 is brought into self-oscillation mode during the DQST and DQSC signals being clamped at the same logic (high or low) levels as each other. In the examples of the third and fourth cases, the i0, i1, i2, and i3 signals achieve oscillation within two clock cycles from the first clocking of the DQST and DQSC signals (i.e., by time T10 for the third case and by time T15 for the fourth case).

Figure 6B:
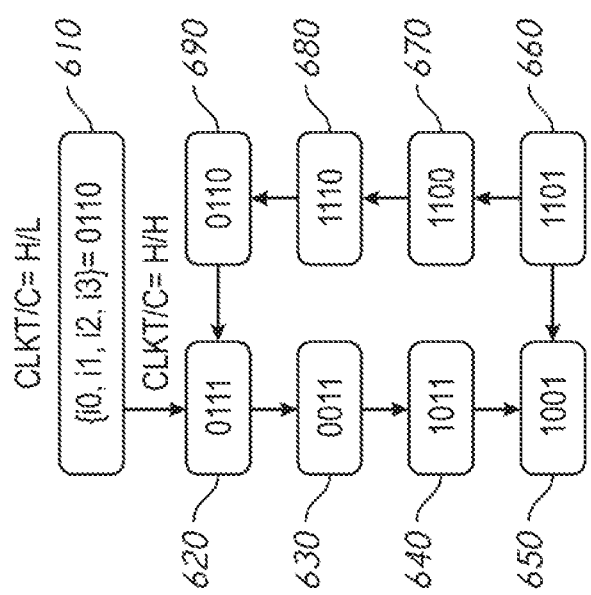
FIG. 6B is a self-oscillation state diagram of the self-oscillation mode of FIG. 6A.
Figure 6A:
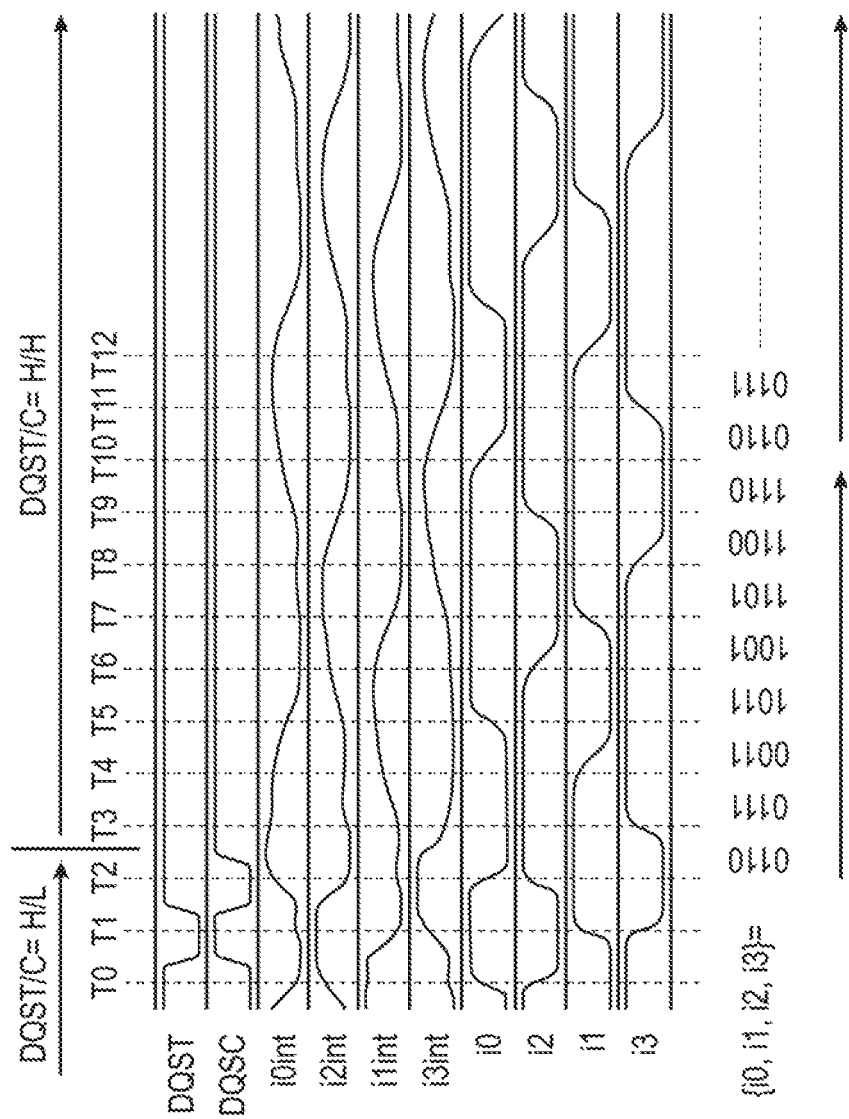
FIG. 6A is a timing diagram for a self-oscillation mode of the quadrant divider circuit of FIG. 3A according to an embodiment of the disclosure.

FIG. 6A is a timing diagram for a self-oscillation mode of the quadrant divider circuit 300 according to an embodiment of the disclosure. FIG. 6B is a self-oscillation state diagram of the self-oscillation mode of FIG. 6A.

At time T0, the DQST and DQSC signals are at high clock level and the low clock level, respectively. The clocked inverter circuits 302 and 306 are activated and the clocked inverter circuits 304 and 308 are not activated. The i0*int* and i2*int* signals change to low and high clock levels, respectively, which cause the i0 signal provided by the inverter circuit 312 to change to the high clock level and cause the i2 signal provided by the inverter circuit 316 to change to the low clock level.

At time T1, the DQST and DQSC signals are at the low clock level and the high clock level, respectively. The clocked inverter circuits 304 and 308 are activated and the clocked inverter circuits 302 and 306 are not activated. The i1*int* and i3*int* signals change to low and high clock levels, respectively, which cause the i1 signal provided by the inverter circuit 318 to change to the high clock level and cause the i3 signal provided by the inverter circuit 314 to change to the low clock level.

At time T2, the DQST and DQSC signals are at again at the high clock level and the low clock level, respectively. The clocked inverter circuits 302 and 306 are activated again and the clocked inverter circuits 304 and 308 are not activated. The i0*int* and i2*int* signals change to high and low clock levels, respectively, which cause the i0 signal provided by the inverter circuit 312 to change to the low clock level and cause the i2 signal provided by the inverter circuit 316 to change to the high clock level.

Following time T2, the clock levels of the i0, i1, i2, and i3 signals are {i0, i1, i2, i3}=0110 (i.e., i0 is at the low clock level, i1 is at the high clock level, i2 is at the high clock level, and i3 is at the low clock level). From this condition, the quadrant divider circuit 300 may provide i0, i1, i2, and i3 signals that continue to oscillate (i.e., self-oscillating condition) although both the DQST and DQSC signals are at the same clock level. For example, as shown in FIG. 6A, both the DQST and DQSC signals are at the high clock level at time T3.

The i0*int*, i1*int*, i2*int*, and i3*int* signals continue to change clock levels sufficient enough to cause the inverter circuits 312, 318, 316, and 314 to provide oscillating i0, i1, i2, and i3 clock signals. For example, as shown in FIG. 6A, and also with reference to FIG. 6B, from the condition {i0, i1, i2, i3}=0110 between times T2 and T3, the clock levels of the i0, i1, i2, and i3 signals change to {i0, i1, i2, i3}=0111. From the condition ({i0, i1, i2, i3}=0111 between times T3 and T4, the clock levels of the i0, i1, i2, and i3 signals change to {i0, i1, i2, i3}=0011. The clock levels of the i0, i1, i2, and i3 signals continue to change despite both the DQST and DQSC signals remaining at the high clock level. The i0, i1, i2 and i3 signals change from {i0, i1, i2, i3}=0011 between times T4 and T5 to {i0, i1, i2, i3}=1011 between times T5 and T6, and then to {i0, i1, i2, i3}=1001 between times T6 and T7, to {i0, i1, i2, i3}=1101 between times T7 and T8, to {i0, i1, i2, i3}=1100 between times T8 and T9, to {i0, i1, i2, i3}=1110 between times T9 and T10, and back to {i0, i1, i2, i3}=0110 between times T10 and T11. As before between times T3 and T4, the i0, i1, i2, and i3 signals changes from 0110 to 0111 between times T11 and T12. The states of i0, i1, i2, and i3 continue to change as previously described with reference to times T4 through T10 before repeating the cycle again from 0110.

The cycle of the i0, i1, i2, and i3 signals changing through the different states from {i0, i1, i2, i3}=0110, through 0111, 0011, 1011, 1001, 1101, 100, 1110, and back to {i0, i1, i2, i3}=0110 before repeating is shown in FIG. 6B.

FIG. 6B shows the progression through the different states of the i0, i1, i2, and i3 signals during self-oscillation of the quadrant divider circuit 300. As shown, also with reference to FIG. 6A, condition 610 of FIG. 6B represents the states of the i0, i1, i2, and i3 signals between times T2 and T3. Condition 620 represents the states of the i0, i1, i2, and i3 signals between times T3 and T4 after both the DQST and DQSC signals change to the high clock level. Condition 630 represents the states of the i0, i1, i2, and i3 signals between times T4 and T5. Condition 640 represents the states of the i0, i1, i2, and i3 signals between times T5 and T6. Condition 650 represents the states of the i0, i1, i2, and i3 signals between times T6 and T7. Condition 660 represents the states of the i0, i1, i2, and i3 signals between times T7 and T8. Condition 670 represents the states of the i0, i1, i2, and i3 signals between times T8 and T9. Condition 680 represents the states of the i0, i1, i2, and i3 signals between times T9 and T10. Condition 690 represents the states of the i0, i1, i2, and i3 signals between times T10 and T11. From condition 690, the cycle repeats by changing to condition 620, which represents the states of the i0, i1, i2, and i3 signals between times T11 and T12.

FIGS. 7A-7I are schematic diagrams of the quadrant divider circuit 300 at the various conditions for i0, i1, i2, and i3 previously described for self-oscillation according to an embodiment of the disclosure.

Figure 7A:
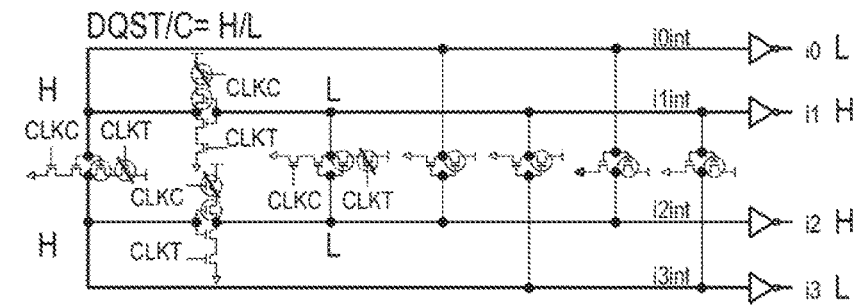

FIG. 7A shows the quadrant divider circuit 300 for condition 610, that is, the DQST and DQSC signals are at the high and low clock levels, respectively, and {i0, i1, i2, i3}=0110 (in FIGS. 7A-7I, "L"=0 and "H"=1). The clocked inverter circuits 302 and 306 are activated and clocked inverter circuits 304 and 308 are not activated.

Figure 7B:
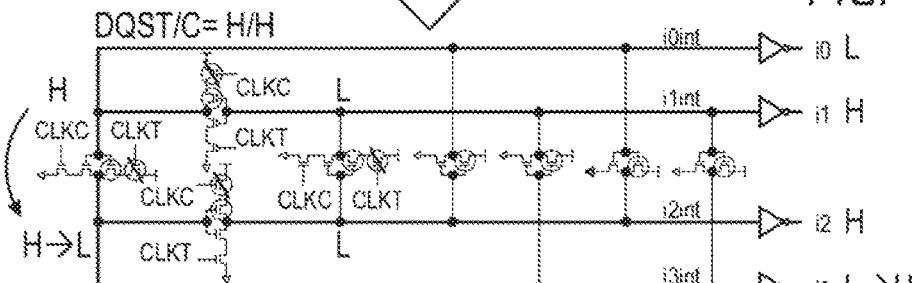

FIG. 7B shows the quadrant divider circuit 300 when changing from condition 610 to condition 620 (with reference to FIG. 6B). The DQST and DQSC signals are both at the high clock level, activating the n-type transistor 338 and not activating the p-type transistor 332 (with reference to FIG. 3B) of the clocked inverter circuits 302, 304, 306, and 308. The high clock level provided to the input node of the clocked inverter circuit 304 causes the activated n-type transistors 336 and 338 of the clocked inverter circuit 304 to provide a low clock level i3*int* signal (H→L) at its output node. The low clock level of the i3*int* signal provided at the output node of the clocked inverter circuit 304 is inverted by the inverter circuit 314 to provide a high clock level i3 signal (L→H). As a result, the state of the i0, i1, i2, and i3 signals changes from 0110 to {i0, i1, i2, i3}=0111.

Figure 7C:
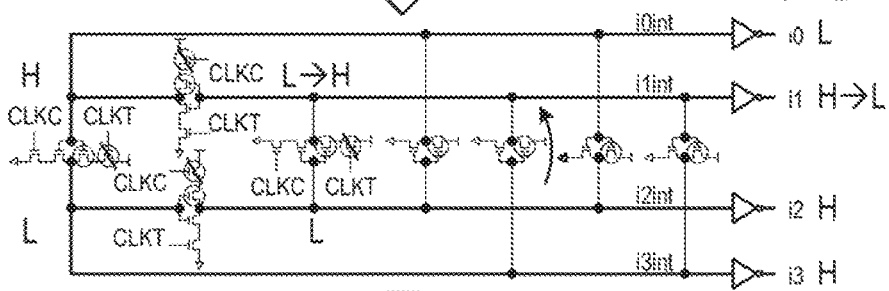

FIG. 7C shows the quadrant divider circuit 300 when changing from condition 620 to condition 630. Although the DQST and DQSC signals both remain at the high clock level, the low clock level at the output node of the clocked inverter circuit 304 is inverted by the inverter circuit 324 to provide a high clock level i1*int* signal (L→H). The high clock level of the i1*int* signal provided at the output node of the inverter circuit 324 is inverted by the inverter circuit 318 to provide a high clock level i1 signal (H→L). As a result, the state of the i0, i1, i2, and i3 signals changes from 0111 to {i0, i1, i2, i3}=0011.

Figure 7D:
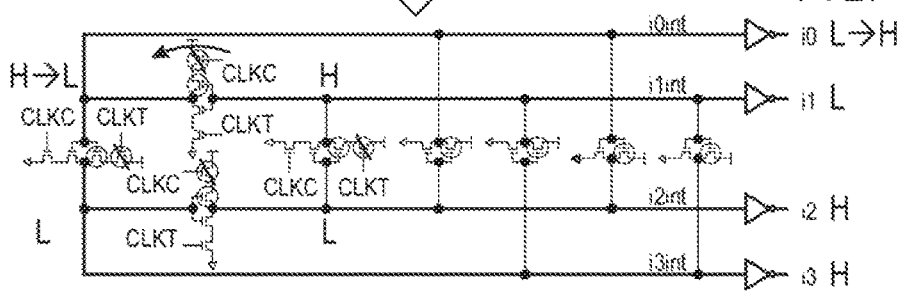

FIG. 7D shows the quadrant divider circuit 300 when changing from condition 630 to condition 640. The high clock level i3*int* signal at the output node of the inverter circuit 324 is inverted through the activated n-type transistors 336 and 338 of the clocked inverter circuit 302 to provide a low clock level i0*int* signal (H→L). The low clock level of the i0*int* signal provided at the output node of the clocked inverter circuit 302 is inverted by the inverter circuit 312 to provide a high clock level i0 signal (L→H). As a result, the state of the i0, i1, i2, and i3 signals changes from 0011 to {i0, i1, i2, i3}=1011.

Figure 7E:
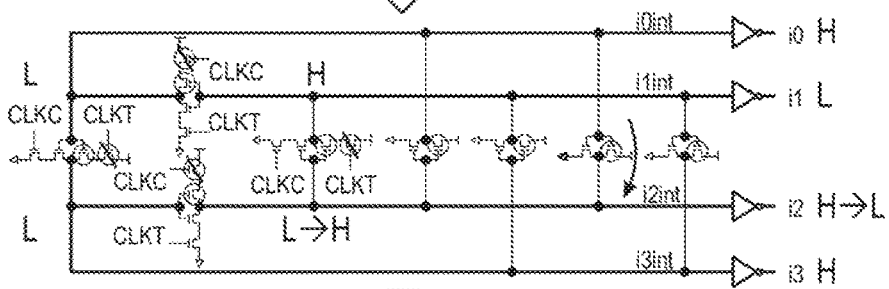

FIG. 7E shows the quadrant divider circuit 300 when changing from condition 640 to condition 650. The low clock level i0*int* signal at the output node of the clocked inverter circuit 302 is inverted by the inverter circuit 326 to provide a high clock level i2*int* signal (L→H). The high clock level of the i2*int* signal provided at the output node of the inverter circuit 326 is inverted by the inverter circuit 316 to provide a low clock level i2 signal (H→L). As a result, the state of the i0, i1, i2, and i3 signals changes from 1011 to {i0, i1, i2, i3}=1001.

FIG. 7F shows the quadrant divider circuit 300 when changing from condition 650 to condition 660. The high clock level i2*int* signal at the output node of the inverter circuit 326 is inverted through the activated n-type transistors 336 and 338 of the clocked inverter circuit 308 to provide a low clock level i1*int* signal (H→L). The low clock level of the i1*int* signal provided at the output node of the clocked inverter circuit 308 is inverted by the inverter circuit 318 to provide a high clock level i1 signal (L→H). As a result, the state of the i0, i1, i2, and i3 signals changes from 1001 to {i0, i1, i2, i3}=1101.

FIG. 7G shows the quadrant divider circuit 300 when changing from condition 660 to condition 670. The low clock level i1*int* signal at the output node of the clocked inverter circuit 308 is inverted by the inverter circuit 328 to provide a high clock level i3*int* signal (L→H). The high clock level of the i3*int* signal provided at the output node of the inverter circuit 328 is inverted by the inverter circuit 314 to provide a low clock level i3 signal (H→L). As a result, the state of the i0, i1, i2, and i3 signals changes from 1101 to {i0, i1, i2, i3}=1100.

FIG. 7H shows the quadrant divider circuit 300 when changing from condition 670 to condition 680. The high clock level i3*int* signal at the output node of the inverter circuit 328 is inverted through the activated n-type transistors 336 and 338 of the clocked inverter circuit 306 to provide a low clock level i2*int* signal (H→L). The low clock level of the i2*int* signal provided at the output node of the clocked inverter circuit 306 is inverted by the inverter circuit 316 to provide a high clock level i2 signal (L→H). As a result, the state of the i0, i1, i2, and i3 signals changes from 1100 to {i0, i1, i2, i3}=1110.

FIG. 7I shows the quadrant divider circuit 300 when changing from condition 680 to condition 690. The low clock level i2*int* signal at the output node of the clocked inverter circuit 306 is inverted by the inverter circuit 322 to provide a high clock level i0*int* signal (L→H). The high clock level of the i0*int* signal provided at the output node of the inverter circuit 322 is inverted by the inverter circuit 312 to provide a low clock level i0 signal (H→L). As a result, the state of the i0, i1, i2, and i3 signals changes from 1110 to {i0, i1, i2, i3}=0110.

From condition 690 of FIG. 7I, the quadrant divider circuit 300 changes to condition 620 of FIG. 7B. The conditions continue to change during self-oscillation, advancing through each of the conditions previously described to provide oscillating i0, i1, i2, and i3 signals.

While FIGS. 6A and 6B, and FIGS. 7A-7I have been described with reference to the DQST and DQSC signals changing from high and low clock levels, respectively, to both having the high clock level, it will be appreciated that other sequences of conditions are possible for different states of the DQST and DQSC signals. For example, the DQST and DQSC signals may change from high and low clock levels, respectively, to both having the low clock level. Another example is where the DQST and DQSC signals change from low and high clock levels, respectively, to both having the high clock level. Another example is where the DQST and DQSC signals change from low and high clock levels, respectively, to both having the low clock level. It will appreciated that the quadrant divider circuit 300 may achieve self-oscillation from various combination of initial states for the DQST and DQSC signals to provide oscillating i0, i1, i2, and i3 signals.

Figure 8A:
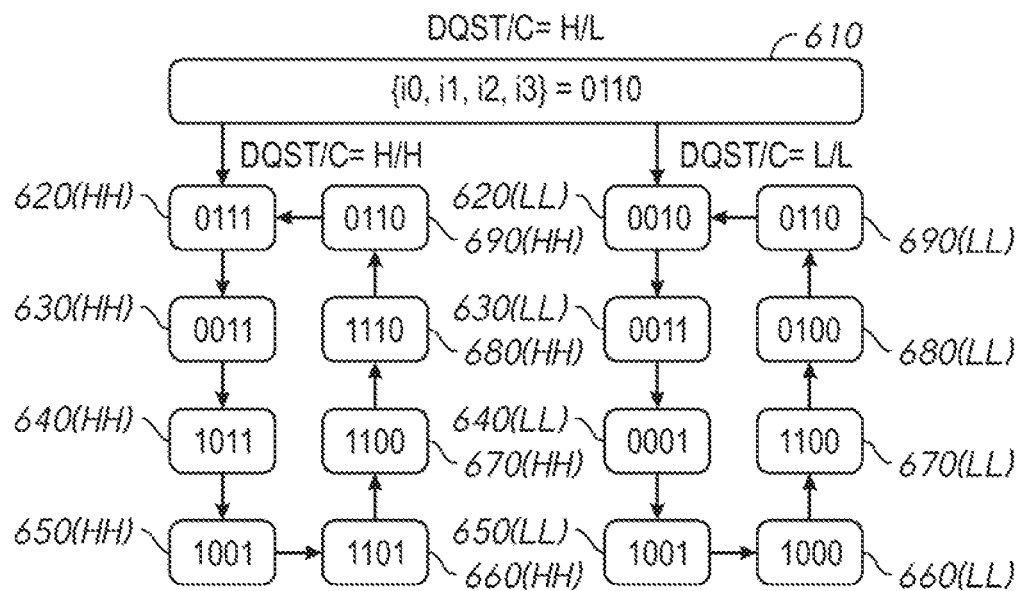
FIGS. 8A and 8B are self-oscillation state diagrams of self-oscillation modes for different initial states according to an embodiment of the disclosure.
Figure 8B:
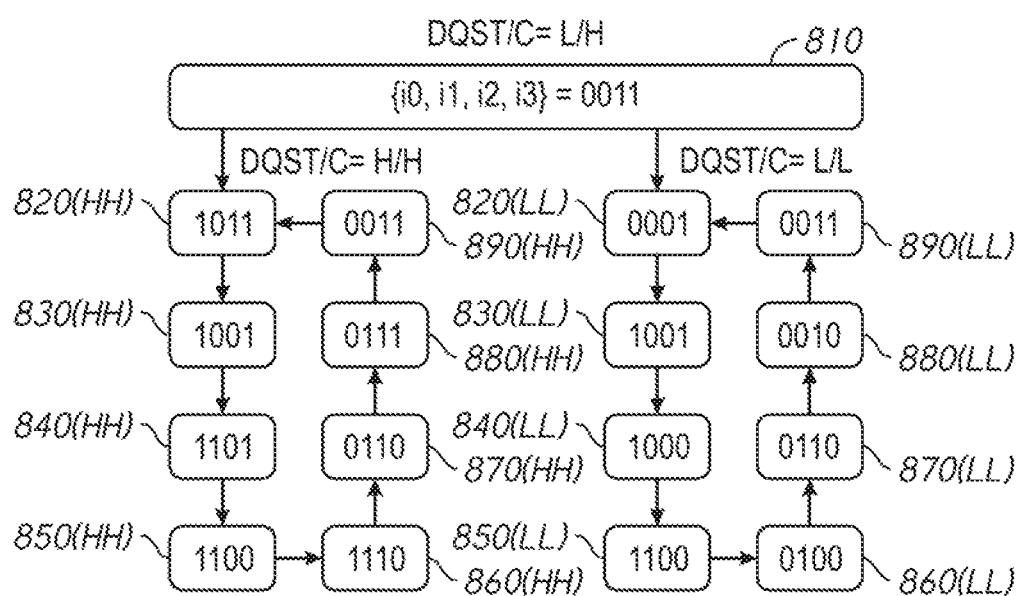

FIGS. 8A and 8B are self-oscillation state diagrams of self-oscillation modes for different initial states of the DQST and DQSC signals. FIG. 8A illustrates an initial state for the DQST and DQSC signals of high and low clock levels, respectively, according to an embodiment of the disclosure. FIG. 8B illustrates an initial state for the DQST and DQSC signals of low and high clock levels, respectively, according to an embodiment of the disclosure.

FIG. 8A shows an initial state of the DQST and DQSC signals at condition 610. The conditions 620(HH)-690(HH) show the sequence for the DQST and DQSC changing from the initial condition 610 of having high and low clock levels, respectively, to both the DQST and DQSC signals having the high clock level with the states of the i0, i1, i2, and i3 signals {i0, i1, i2, i3}=0110. The conditions 620(HH)-690(HH) correspond to the conditions 620-690 described with reference to FIG. 6B, but are additionally labeled with "(HH)" in FIG. 8A. Consequently, the previous description of conditions 620-690 and the sequence therethrough also apply to conditions 620(HH)-690(HH). In the interest of brevity, conditions 620(HH)-690(HH) will not be described in detail again with reference to FIG. 8A.

The conditions 620(LL)-690(LL) show the sequence for the DQST and DQSC changing from the initial condition 610 of having high and low clock levels to both the DQST and DQSC signals having the low clock level with the states of the i0, i1, i2, and i3 signals {i0, i1, i2, i3}=0110.

Changing to low clock levels for both the DQST and DQSC signals activate the p-type transistor 332 and not activate the n-type transistor 338 (with reference to FIG. 3B) of the clocked inverter circuits 302, 304, 306, and 308. As a result, the clocked inverters 302, 304, 306, and 308 provide high clock levels at the respective output nodes when the signal provided to the respective input nodes is at the low clock levels. The resulting sequence of conditions is shown by conditions 620(LL)-690(LL).

For example, when the DQST and DQSC change from having high and low clock levels, respectively, to both having the low clock level (i.e., changing from condition 610 to condition 620(LL)), the i1*int* signal provided by the clocked inverter circuit 308 changes to a high clock level. The high clock level i1*int* signal causes the inverter circuit 318 to provide a low clock level i1 signal. As a result, the state of the i0, i1, i2, and i3 signals changes from 0110 to {i0, i1, i2, i3}=0010.

For condition 630(LL), the high clock level i1*int* signal is inverted by the inverter circuit 328 to provide a low clock level i3*int* signal. The low clock level of the i3*int* signal is inverted by the inverter circuit 314 to provide a high clock level i3 signal. As a result, the state of the i0, i1, i2, and i3 signals changes from 0010 to {i0, i1, i2, i3}=0011.

For condition 640(LL), the low clock level i3*int* signal is inverted through the activated p-type transistors 332 and 334 of the clocked inverter 306 to provide a high clock level i2*int* signal. The high clock level of the i2*int* signal is inverted by the inverter circuit 316 to provide a low clock level i2 signal. As a result, the state of the i0, i1, i2, and i3 signals changes from 0011 to {i0, i1, i2, i3}=0001.

For condition 650(LL), the high clock level i2*int* signal is inverted by the inverter circuit 322 to provide a low clock level i0*int* signal. The low clock level of the i0*int* signal is inverted by the inverter circuit 312 to provide a high clock level i0 signal. As a result, the state of the i0, i1, i2, and i3 signals changes from 0001 to {i0, i1, i2, i3}=1001.

For condition 660(LL), the low clock level i0*int* signal is inverted through the activated p-type transistors 332 and 334 of the clocked inverter 304 to provide a high clock level i3*int* signal. The high clock level of the i3*int* signal is inverted by the inverter circuit 314 to provide a low clock level i3 signal. As a result, the state of the i0, i1, i2, and i3 signals changes from 1001 to {i0, i1, i2, i3}=1000.

For condition 670(LL), the high clock level i2*int* signal is inverted by the inverter circuit 324 to provide a low clock level i1*int* signal. The low clock level of the i1*int* signal is inverted by the inverter circuit 318 to provide a high clock level i1 signal. As a result, the state of the i0, i1, i2, and i3 signals changes from 1000 to {i0, i1, i2, i3}=1100.

For condition 680(LL), the low clock level i1*int* signal is inverted through the activated p-type transistors 332 and 334 of the clocked inverter 302 to provide a high clock level i0*int* signal. The high clock level of the i0*int* signal is inverted by the inverter circuit 312 to provide a low clock level i0 signal. As a result, the state of the i0, i1, i2, and i3 signals changes from 1100 to {i0, i1, i2, i3}=0100.

For condition 690(LL), the high clock level i0*int* signal is inverted by the inverter circuit 326 to provide a low clock level i2*int* signal. The low clock level of the i2*int* signal is inverted by the inverter circuit 316 to provide a high clock level i2 signal. As a result, the state of the i0, i1, i2, and i3 signals changes from 0100 to {i0, i1, i2, i3}=0110.

From condition 690(LL), the quadrant divider circuit 300 changes to condition 620(LL). The conditions continue to change during self-oscillation, advancing through each of the conditions previously described to provide oscillating i0, i1, i2, and i3 signals.

The states of the i0, i1, i2, and i3 signals for the initial condition of DQST and DQSC having high and low clock levels, respectively, that result in self-oscillation after the DQST and DQSC are clamped to the same clock level has been described as {i0, i1, i2, i3}=0110. However, other initial states for the i0, i1, i2, and i3 signals may be used to achieve self-oscillation when the DQST and DQSC have high and low clock levels, respectively, and then change to having the same clock level. For example, another initial state for the i0, i1, i2, and i3 signals may be {i0, i1, i2, i3}=1001. That is, the quadrant divider circuit 300 may enter self-oscillation for an initial condition when the DQST and DQSC have high and low clock levels, respectively, and {i0, i1, i2, i3}=1001, before the DQST and DQSC are clamped to the same clock level. More generally, the rule for the states of i0, i1, i2, and i3 for self-oscillation for DQST and DQSC having high and low clock levels, respectively, before being clamped to the same clock level is (all four conditions met):

(1) the i0 and i2 signals are complementary; (2) the i1 and i3 signals are complementary; (3) the i0 and i1 signals are complementary; and (4) the i2 and i3 signals are complementary.

FIG. 8B shows an initial state of the DQST and DQSC signals at condition 810. The conditions 820(HH)-890(HH) show the sequence for the DQST and DQSC changing from the initial condition 810 of having low and high clock levels, respectively, to both the DQST and DQSC signals having the high clock level with the states of the i0, i1, i2, and i3 signals {i0, i1, i2, i3}=0011. Changing to high clock levels for both the DQST and DQSC signals activate the n-type transistor 338 and not activate the p-type transistor 332 (with reference to FIG. 3B) of the clocked inverter circuits 302, 304, 306, and 308. As a result, the clocked inverters 302, 304, 306, and 308 provide low clock levels at the respective output nodes when the signal provided to the respective input nodes is at the high clock levels. The resulting sequence of conditions is shown by conditions 820(HH)-890(HH).

For example, when the DQST and DQSC change from having low and high clock levels, respectively, to both having the high clock level (i.e., changing from condition 810 to condition 820(HH)), the n-type transistors 336 and 338 of the clocked inverter circuit 302 cause the i0*int* signal to change to a low clock level. The low clock level i0*int* signal causes the inverter circuit 312 to provide a high clock level i0 signal. As a result, the state of the i0, i1, i2, and i3 signals changes from 0011 to {i0, i1, i2, i3}=1011.

For condition 830(HH), the low clock level i0*int* signal is inverted by the inverter circuit 326 to provide a high clock level i2*int* signal. The high clock level of the i2*int* signal is inverted by the inverter circuit 318 to provide a high clock level i2 signal. As a result, the state of the i0, i1, i2, and i3 signals changes from 1011 to {i0, i1, i2, i3}=1001.

For condition 840(HH), the high clock level i2*int* signal is inverted through the activated n-type transistors 336 and 338 of the clocked inverter 308 to provide a low clock level i1*int* signal. The low clock level of the i1*int* signal is inverted by the inverter circuit 318 to provide a high clock level i1 signal. As a result, the state of the i0, i1, i2, and i3 signals changes from 1001 to {i0, i1, i2, i3}=1101.

For condition 850(HH), the low clock level i1*int* signal is inverted by the inverter circuit 328 to provide a high clock level i3*int* signal. The high clock level of the i3*int* signal is inverted by the inverter circuit 314 to provide a low clock level i3 signal. As a result, the state of the i0, i1, i2, and i3 signals changes from 1101 to {i0, i1, i2, i3}=1100.

For condition 860(HH), the high clock level i3*int* signal is inverted through the activated n-type transistors 336 and 338 of the clocked inverter 306 to provide a low clock level i2*int* signal. The low clock level of the i2*int* signal is inverted by the inverter circuit 316 to provide a high clock level i2 signal. As a result, the state of the i0, i1, i2, and i3 signals changes from 1100 to {i0, i1, i2, i3}=1110.

For condition 870(HH), the low clock level i2*int* signal is inverted by the inverter circuit 322 to provide a high clock level i0*int* signal. The high clock level of the i0*int* signal is inverted by the inverter circuit 312 to provide a low clock level i0 signal. As a result, the state of the i0, i1, i2, and i3 signals changes from 1110 to {i0, i1, i2, i3}=0110.

For condition 880(HH), the high clock level i0*int* signal is inverted through the activated n-type transistors 336 and 338 of the clocked inverter 304 to provide a low clock level i3*int* signal. The low clock level of the i3*int* signal is inverted by the inverter circuit 314 to provide a high clock level i3 signal. As a result, the state of the i0, i1, i2, and i3 signals changes from 0110 to {i0, i1, i2, i3}=0111.

For condition 890(HH), the low clock level i3*int* signal is inverted by the inverter circuit 324 to provide a high clock level i1*int* signal. The high clock level of the i1*int* signal is inverted by the inverter circuit 318 to provide a low clock level i1 signal. As a result, the state of the i0, i1, i2, and i3 signals changes from 0111 to {i0, i1, i2, i3}=0011.

From condition 890(HH), the quadrant divider circuit 300 changes to condition 820(HH). The conditions continue to change during self-oscillation, advancing through each of the conditions previously described to provide oscillating i0, i1, i2, and i3 signals.

The conditions 820(LL)-890(LL) show the sequence for the DQST and DQSC changing from an initial condition 810 of having low and high clock levels, respectively, to both the DQST and DQSC signals having the low clock level with the states of the i0, i1, i2, and i3 signals {i0, i1, i2, i3}=0011. Changing to low clock levels for both the DQST and DQSC signals activate the p-type transistor 332 and not activate the n-type transistor 338 (with reference to FIG. 3B) of the clocked inverter circuits 302, 304, 306, and 308. As a result, the clocked inverters 302, 304, 306, and 308 provide high clock levels at the respective output nodes when the signal provided to the respective input nodes is at the low clock levels. The resulting sequence of conditions is shown by conditions 820(LL)-890(LL).

For example, when the DQST and DQSC change from having low and high clock levels, respectively, to both having the low clock level (i.e., changing from condition 810 to condition 820(LL)), the i2*int* signal provided by the clocked inverter circuit 306 changes to a high clock level. The high clock level i2*int* signal causes the inverter circuit 316 to provide a low clock level i2 signal. As a result, the state of the i0, i1, i2, and i3 signals changes from 0011 to {i0, i1, i2, i3}=0001.

For condition 830(LL), the high clock level i2*int* signal is inverted by the inverter circuit 322 to provide a low clock level i0*int* signal. The low clock level of the i0*int* signal is inverted by the inverter circuit 312 to provide a high clock level i0 signal. As a result, the state of the i0, i1, i2, and i3 signals changes from 0001 to {i0, i1, i2, i3}=1001.

For condition 840(LL), the low clock level i0*int* signal is inverted through the activated p-type transistors 332 and 334 of the clocked inverter 304 to provide a high clock level i3*int* signal. The high clock level of the i3*int* signal is inverted by the inverter circuit 314 to provide a low clock level i3 signal. As a result, the state of the i0, i1, i2, and i3 signals changes from 1001 to {i0, i1, i2, i3}=1000.

For condition 850(LL), the high clock level i3*int* signal is inverted by the inverter circuit 324 to provide a low clock level i1*int* signal. The low clock level of the i1*int* signal is inverted by the inverter circuit 318 to provide a high clock level i1 signal. As a result, the state of the i0, i1, i2, and i3 signals changes from 1000 to {i0, i1, i2, i3}=1100.

For condition 860(LL), the low clock level i1*int* signal is inverted through the activated p-type transistors 332 and 334 of the clocked inverter 302 to provide a high clock level i0*int* signal. The high clock level of the i0*int* signal is inverted by the inverter circuit 312 to provide a low clock level i0 signal. As a result, the state of the i0, i1, i2, and i3 signals changes from 1100 to {i0, i1, i2, i3}=0100.

For condition 870(LL), the high clock level i0*int* signal is inverted by the inverter circuit 326 to provide a low clock level i2*int* signal. The low clock level of the i2*int* signal is inverted by the inverter circuit 316 to provide a high clock level i2 signal. As a result, the state of the i0, i1, i2, and i3 signals changes from 0100 to {i0, i1, i2, i3}=0110.

For condition 880(LL), the low clock level i2*int* signal is inverted through the activated p-type transistors 332 and 334 of the clocked inverter 308 to provide a high clock level i1*int* signal. The high clock level of the i1*int* signal is inverted by the inverter circuit 318 to provide a low clock level i1 signal. As a result, the state of the i0, i1, i2, and i3 signals changes from 0110 to {i0, i1, i2, i3}=0010.

For condition 890(LL), the high clock level i1*int* signal is inverted by the inverter circuit 328 to provide a low clock level i3*int* signal. The low clock level of the i3*int* signal is inverted by the inverter circuit 314 to provide a high clock level i3 signal. As a result, the state of the i0, i1, i2, and i3 signals changes from 0010 to {i0, i1, i2, i3}=0011.

From condition 890(LL), the quadrant divider circuit 300 changes to condition 820(LL). The conditions continue to change during self-oscillation, advancing through each of the conditions previously described to provide oscillating i0, i1, i2, and i3 signals.

The states of the i0, i1, i2, and i3 signals for the initial condition of DQST and DQSC having low and high clock levels, respectively, that result in self-oscillation after the DQST and DQSC are clamped to the same clock level has been described as ({i0, i1, i2, i3}=0011. However, other initial states for the i0, i1, i2, and i3 signals may be used to achieve self-oscillation when the DQST and DQSC have low and high clock levels, respectively, and then change to having the same clock level. For example, another initial state for the i0, i1, i2, and i3 signals may be {i0, i1, i2, i3}=1100. That is, the quadrant divider circuit 300 may enter self-oscillation for an initial condition when the DQST and DQSC have low and high clock levels, respectively, and (i0, i1, i2, i3)=1100, before the DQST and DQSC are clamped to the same clock level. More generally, the rule for the states of i0, i1, i2, and i3 for self-oscillation for DQST and DQSC having low and high clock levels, respectively, before being clamped to the same clock level is (all four conditions met):

(1) the i0 and i2 signals are complementary; (2) the i1 and i3 signals are complementary; (3) the i0 and i3 signals are complementary; and (4) the i1 and i2 signals are complementary.

A quadrant divider circuit according to an embodiment of the disclosure may have a short delay time between the input of DQST and DQSC signals and the output of the i0, i1, i2, and i3 quadrature clock signals, because only a few inverter circuits are equivalently inserted in the forward clock path. Additionally, even in condition where the DQST and DQSC signals initiate clocking from the same clamped levels (low or high) of both signals, it may be that two clock cycles of DQST and DQSC signals are needed as recovery time. Moreover, the area occupied by a quadrant divider circuit according to an embodiment of the disclosure occupies less area in comparison with conventional quadrant divider circuits, for example, as shown and previously described with reference to FIG. 2.

Figure 9:
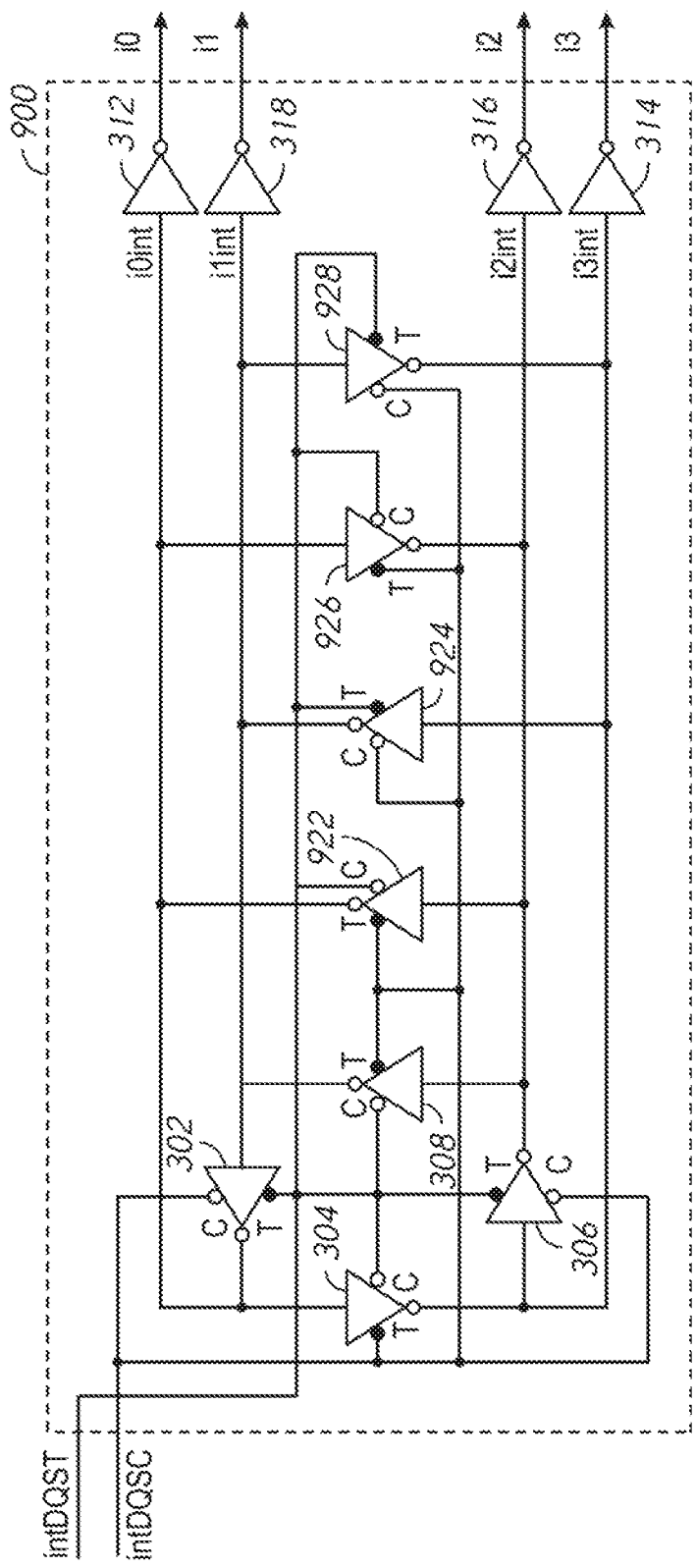
FIG. 9 illustrates a quadrant divider circuit according to an embodiment of the disclosure.

FIG. 9 illustrates a quadrant divider circuit 900 according to an embodiment of the disclosure. The quadrant divider circuit 900 provides multiphase signals i0, i1, i2, and i3 responsive to intDQST and intDQSC signals. The quadrant divider circuit 900 is similar to the quadrant divider circuit 300 of FIG. 3, and includes similar circuits, which are referenced in FIG. 9 using the same references numbers that are used in FIG. 3. For example, the quadrant divider circuit 900 includes clocked inverter circuits 302, 304, 306, and 308 coupled in a ring. Inverter circuits 312, 314, 316, and 318 receive output signals i0*int*, i3*int*, i2*int*, i1*int* from the output nodes of the clocked inverter circuits 302, 304, 306, and 308, respectively, and provide respective output signals i0, i1, i2, and i3.

Instead of including inverter circuits 322 and 326 and inverter circuits 324 and 328, the quadrant divider circuit 900 includes clocked inverter circuits 922 and 926 coupled between the output nodes of the clocked inverter circuits 302 and 306, and further includes clocked inverter circuits 924 and 928 coupled between the output nodes of the clocked inverter circuits 304 and 308. The clocked inverter circuits 922 and 926 are activated when the intDQST and intDQSC signals have high and low clock levels, respectively, which also activate the clocked inverter circuits 304 and 308. The clocked inverter circuits 924 and 928 are activated when the intDQST and intDQSC signals have low and high clock levels, respectively, which also activate the clocked inverter circuits 302 and 306.

The i0, i1, i2, and i3 signals provided by the quadrant divider circuit 900 have a 90 degree phase relative to one another, and may be referred to as "quadrature" clock signals. The output signals also have a clock frequency that is one-half the clock frequency of the intDQST and intDQSC signals. The phase relationship and frequency of the i0, i1, i2, and i3 signals are the same as that shown for the i0, i1, i2, and i3 signals of FIG. 1B.

As previously discussed, the quadrant divider circuit 300 may enter self-oscillation to provide the i0, i1, i2, and i3 signals when the DQST and DQSC signals are clamped at the same clock levels. The quadrant divider circuit 900, however, will not enter self-oscillation when the DQST and DQSC signals are clamped at the same clock levels because the clocked inverter circuits 922, 924, 926, and 928 are not fully activated when the DQST and DQSC signals are clamped to the same clock level. That is, the clocked inverter circuits 922, 924, 926, and 928 may have operability when the DQST and DQSC signals are clamped at the same clock level to either provide only a low clock level signal when a high clock level signal is provided or provide only a high clock level signal when a low clock level signal is provided. As such, self-oscillation may not be achieved while the DQST and DQSC signals are at the same clock level.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
a quadrant divider circuit configured to receive first and second strobe signals and provide oscillating quadrature clock signals, and wherein the quadrant divider circuit is further configured to enter a self-oscillation mode to continue providing the oscillating quadrature clock signals responsive to the quadrature clock signals having respective clock levels corresponding to an initial condition and the first and second strobe signals clamped to a same clock level thereafter.

2. The apparatus of claim 1 wherein the oscillating quadrature clock signals have a clock frequency one-half a clock frequency of the first and second strobe signals.

3. The apparatus of claim 1 wherein the first and second strobe signals are complementary prior to being clamped to the same clock level.

4. The apparatus of claim 1, further comprising:
first, second, third, and fourth bias controlled inverter circuits, each coupled to receive a respective one of the quadrature clock signals from the quadrant divider circuit and provide a respective phase signal;
a plurality of receiver circuits, each coupled to a respective data terminal and configured to capture respective data responsive to the phase signals from the first, second, third, and fourth bias controlled inverter circuits and further configured to provide the captured data; and
data read/write control circuitry configured to receive the captured data from the plurality of receiver circuits and further configured to provide the data to be stored in memory.

5. The apparatus of claim 1, further comprising a plurality of bias controlled inverter circuits coupled to the quadrant divider circuit.

6. The apparatus of claim 5, wherein the plurality of bias controlled inverter circuits are configured to provide a plurality of phase signals responsive to the quadrature clock signals.

7. The apparatus of claim 1, further comprising data read/write control circuitry configured to provide data to be stored in memory responsive, at least in part, to the oscillating quadrature clock signals.

8. The apparatus of claim 1, wherein the initial condition includes an initial self-oscillation condition of the quadrature clock signals having respective states.

9. The apparatus of claim 1, wherein each of the quadrature clock signals has a level corresponding to the initial condition of the first and second strobe signals having high and low clock levels, respectively.

10. The apparatus of claim 1, further comprising a plurality of receiver circuits, each configured to capture respective data based, at least in part, on the oscillating quadrature clock signals and further configured to provide the captured data.

11. An apparatus, comprising:
a quadrant divider circuit configured to receive first and second strobe signals and configured to provide oscillating quadrature clock signals; and
a plurality of bias controlled inverter circuits configured to provide phase signals responsive to the quadrature clock signals,
wherein the oscillating quadrature clock signals are generated by the quadrant divider circuit responsive, at least in part, to the first and second strobe signals clamped to a same clock level.

12. The apparatus of claim 11, wherein, prior to being clamped to the same clock level, the first and second strobe signals have levels based on an initial condition.

13. The apparatus of claim 11, wherein the first and second strobe signals are complementary prior to being clamped to the same clock level.

14. The apparatus of claim 11, wherein the oscillating quadrature clock signals have a clock frequency one-half a clock frequency of the first and second strobe signals.

15. The apparatus of claim 11, wherein the oscillating quadrature clock signals are self-oscillating output signals.

16. The apparatus of claim 11, wherein the oscillating quadrature clock signals provided by the quadrant divider circuit have respective states corresponding to an initial self-oscillation condition.

17. An apparatus, comprising:
a quadrant divider circuit comprising a plurality of clocked inverter circuits coupled in a ring, the quadrant divider circuit configured to receive first and second strobe signals and configured to provide oscillating quadrature clock signals; and
a plurality of bias controlled inverter circuits configured to provide phase signals responsive to the oscillating quadrature clock signals,
wherein the oscillating quadrature clock signals are provided based, at least in part, on an initial condition.

18. The apparatus of claim 17, wherein the first and second strobe signals are complementary prior to being clamped to a same clock level.

19. The apparatus of claim 17, wherein the initial condition includes an initial self-oscillation condition of the quadrature clock signals having respective states.

20. The apparatus of claim 17, wherein the quadrant divider circuit is further configured to enter a self-oscillation mode to provide the oscillating quadrature clock signals, and
wherein the oscillating quadrature clock signals have a clock frequency one-half a clock frequency of the first and second strobe signals.

* * * * *